US011724235B2

(12) United States Patent
Nonaka et al.

(10) Patent No.: US 11,724,235 B2
(45) Date of Patent: Aug. 15, 2023

(54) MIXING APPARATUS, MIXING METHOD AND SUBSTRATE PROCESSING SYSTEM

(71) Applicant: Tokyo Electron Limited, Tokyo (JP)

(72) Inventors: Jun Nonaka, Koshi (JP); Takao Inada, Koshi (JP); Kouji Ogura, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 443 days.

(21) Appl. No.: 16/816,379

(22) Filed: Mar. 12, 2020

(65) Prior Publication Data

US 2020/0289994 A1 Sep. 17, 2020

(30) Foreign Application Priority Data

Mar. 13, 2019 (JP) ................................ 2019-046145

(51) Int. Cl.

| | |
|---|---|
| ***B01F 3/08*** | (2006.01) |
| ***B01F 11/02*** | (2006.01) |
| ***B01F 13/02*** | (2006.01) |
| ***B01F 15/06*** | (2006.01) |
| ***B01F 23/40*** | (2022.01) |

(Continued)

(52) U.S. Cl.

CPC ............ *B01F 23/405* (2022.01); *B01F 23/43* (2022.01); *B01F 23/451* (2022.01); *B01F 31/831* (2022.01); *B01F 33/402* (2022.01); *B01F 35/90* (2022.01); *B01F 2035/99* (2022.01); *B01F 2101/58* (2022.01)

(58) Field of Classification Search

CPC .............. B01F 2035/99; B01F 2101/58; B01F 23/405; B01F 23/43; B01F 23/45; B01F 23/451; B01F 23/49; B01F 25/50; B01F 25/53; B01F 31/831; B01F 31/85; B01F 33/402; B01F 33/403; B01F 33/406; B01F 35/90; H01L 21/31111; H01L 21/67086

USPC ........................... 366/136, 137, 159.1, 167.1

See application file for complete search history.

(56) References Cited

U.S. PATENT DOCUMENTS 5,174,855 A * 12/1992 Tanaka ............. H01L 21/67023 216/101

5,235,995 A * 8/1993 Bergman .......... H01L 21/68728 134/182

(Continued)

FOREIGN PATENT DOCUMENTS

| | | |
|---|---|---|
| JP | H7-054167 A | 2/1995 |
| JP | H11-186215 A | 7/1999 |

(Continued)

*Primary Examiner* — Elizabeth Insler

(74) *Attorney, Agent, or Firm* — Pearne & Gordon LLP

(57) ABSTRACT

A mixing apparatus includes a phosphoric acid aqueous solution supply, an additive supply, a tank, a phosphoric acid aqueous solution supply path and an additive supply path. The phosphoric acid aqueous solution supply is configured to supply a phosphoric acid aqueous solution. The additive supply is configured to supply an additive configured to suppress precipitation of a silicon oxide. The phosphoric acid aqueous solution supply path is configured to connect the phosphoric acid aqueous solution supply with the tank. The additive supply path is configured to connect the additive supply with the tank. The additive is supplied while fluidity is imparted to the phosphoric acid aqueous solution supplied from the phosphoric acid aqueous solution supply into the tank.

16 Claims, 15 Drawing Sheets

(51) Int. Cl.

| | |
|---|---|
| ***B01F 23/43*** | (2022.01) |
| ***B01F 23/451*** | (2022.01) |
| ***B01F 31/80*** | (2022.01) |
| ***B01F 33/40*** | (2022.01) |
| ***B01F 35/90*** | (2022.01) |
| *B01F 101/58* | (2022.01) |

(56) References Cited

U.S. PATENT DOCUMENTS

| | | | | |
|---|---|---|---|---|
| 5,277,715 | A * | 1/1994 | Cathey | H01L 21/67057 257/E21.228 |
| 6,001,215 | A * | 12/1999 | Ban | H01L 21/67086 257/E21.25 |
| 2007/0102023 | A1* | 5/2007 | Yi | B08B 3/14 134/108 |
| 2009/0087929 | A1* | 4/2009 | Yu | H01L 21/67253 257/E21.528 |
| 2013/0255882 | A1* | 10/2013 | Takahashi | H01L 21/31111 156/345.15 |
| 2016/0035597 | A1* | 2/2016 | Hinode | H01L 21/6708 216/84 |
| 2019/0112196 | A1 | 4/2019 | Uehara et al. | |
| 2019/0198344 | A1 | 6/2019 | Murakami et al. | |

FOREIGN PATENT DOCUMENTS

| | | | |
|---|---|---|---|
| JP | 2007-173367 | A | 7/2007 |
| JP | 2007-258405 | A | 10/2007 |
| JP | 2009-094455 | A | 4/2009 |
| JP | 2011-515858 | A | 5/2011 |
| JP | 2016-032029 | A | 3/2016 |
| JP | 2016-032030 | A | 3/2016 |
| JP | 2017-118092 | A | 6/2017 |
| JP | 2018-139259 | A | 9/2018 |
| WO | 2009/117642 | A2 | 9/2009 |
| WO | 2017/169602 | A1 | 10/2017 |
| WO | 2018/168874 | A1 | 9/2018 |

* cited by examiner

MIXING APPARATUS, MIXING METHOD AND SUBSTRATE PROCESSING SYSTEM

CROSS-REFERENCE TO RELATED APPLICATION

This application claims the benefit of Japanese Patent Application No. 2019-046145 filed on Mar. 13, 2019, the entire disclosure of which is incorporated herein by reference.

TECHNICAL FIELD

The exemplary embodiments described herein pertain generally to a mixing apparatus, a mixing method and a substrate processing system.

BACKGROUND

Conventionally, there has been known a substrate processing system that performs an etching processing on a substrate by immersing the substrate in an etching solution containing a phosphoric acid aqueous solution and an additive for suppressing the precipitation of a silicon dioxide ($SiO_2$) (see Patent Document 1).

Patent Document 1: Japanese Patent Laid-open Publication No. 2017-118092

SUMMARY

In an exemplary embodiment, a mixing apparatus includes a phosphoric acid aqueous solution supply, an additive supply, a tank, a phosphoric acid aqueous solution supply path and an additive supply path. The phosphoric acid aqueous solution supply is configured to supply a phosphoric acid aqueous solution. The additive supply is configured to supply an additive configured to suppress precipitation of a silicon oxide. The phosphoric acid aqueous solution supply path is configured to connect the phosphoric acid aqueous solution supply with the tank. The additive supply path is configured to connect the additive supply with the tank. The additive is supplied while fluidity is imparted to the phosphoric acid aqueous solution supplied from the phosphoric acid aqueous solution supply into the tank.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
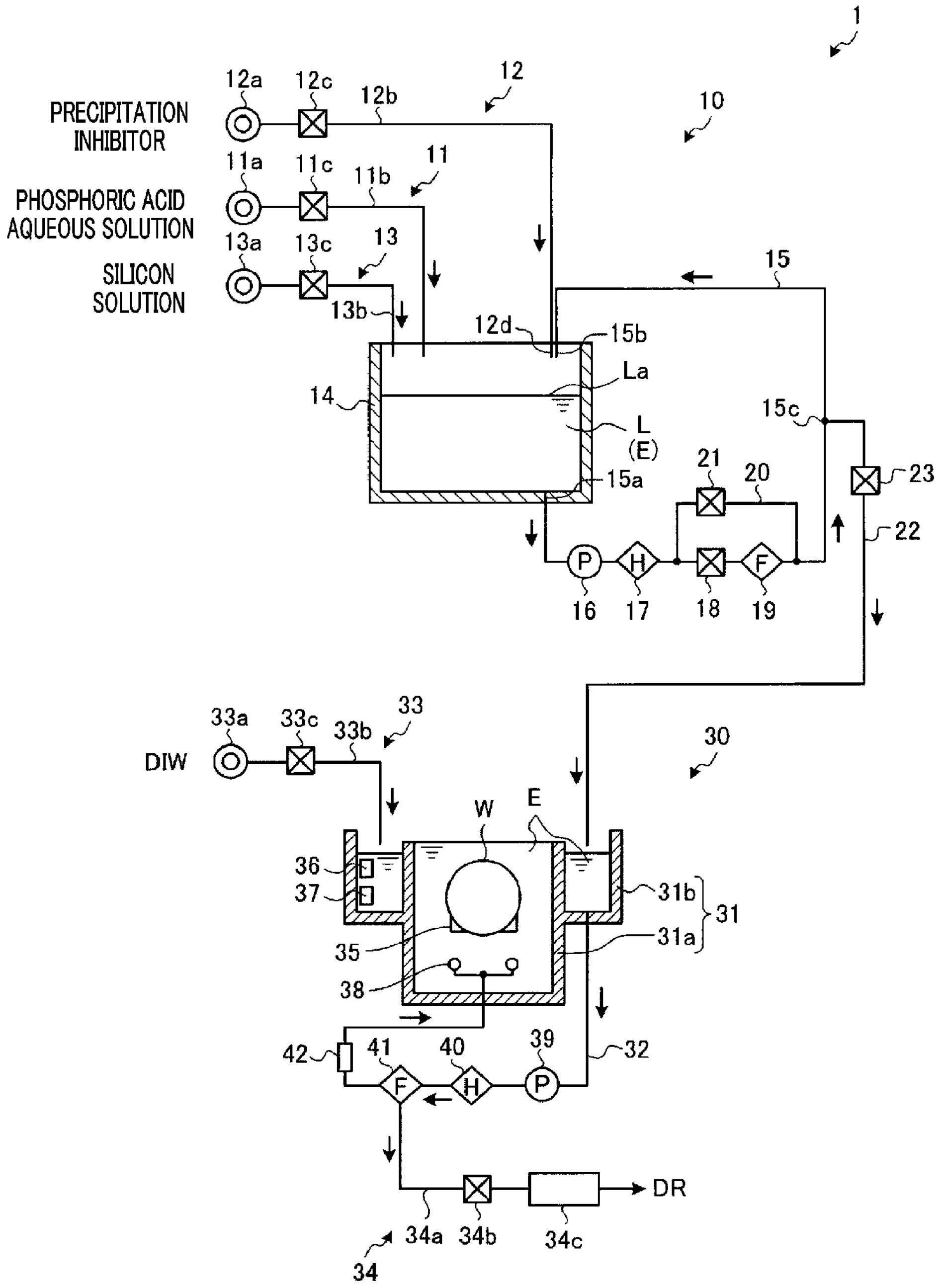
FIG. 1 is a schematic block diagram illustrating a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a mixing apparatus, a mixing method and a substrate processing system according to the present disclosure will be described in detail with reference to the accompanying drawings. Further, the present disclosure is not limited to the following exemplary embodiments. Furthermore, it is to be noted that the drawings are illustrative of the invention, and a relationship between the sizes of components and the proportions of the respective components can be different from the real ones. Also, the drawings may be different from each other in a relationship between the sizes of components and the proportions of the respective components.

Conventionally, there has been known a substrate processing system that performs an etching processing on a substrate by immersing the substrate in an etching solution containing a phosphoric acid aqueous solution and an additive for suppressing precipitation of a silicon oxide.

For example, it is possible to selectively etch, between a silicon nitride film (SiN) and a silicon dioxide film ($SiO_2$) stacked on a substrate, the silicon nitride film by immersing the substrate in a phosphoric acid ($H_3PO_4$) aqueous solution.

Also, it is possible to suppress the precipitation of the silicon oxide on the silicon oxide film during an etching processing by adding the additive (hereinafter, also referred to as "precipitation inhibitor") for suppressing the precipitation of silicon oxide to the phosphoric acid aqueous solution.

However, when the etching solution is produced, if the phosphoric acid aqueous solution and the precipitation inhibitor are not well mixed, etching non-uniformity may occur during the etching processing. Meanwhile, if a lot of time is spent on the mixing processing to mix well the phosphoric acid aqueous solution and the precipitation inhibitor, a sufficient liquid amount required for the etching processing may not be supplied.

Accordingly, a technique capable of efficiently mixing the phosphoric acid aqueous solution and the precipitation inhibitor has been expected.

<Configuration of Substrate Processing System>

First, a configuration of a substrate processing system 1 according to an exemplary embodiment will be described with reference to FIG. 1. FIG. 1 is a schematic block diagram illustrating the configuration of the substrate processing system 1 according to the exemplary embodiment.

The substrate processing system 1 includes a mixing apparatus 10 and a substrate processing apparatus 30. The mixing apparatus 10 is configured to produce an etching solution E by mixing a phosphoric acid aqueous solution L, a precipitation inhibitor for suppressing the precipitation of silicon oxide and a silicon-containing compound aqueous solution (hereinafter, also referred to as "silicon solution"). The precipitation inhibitor is an example of an additive, and the etching solution E is an example of a mixed solution.

That is, the etching solution E according to the exemplary embodiment contains the phosphoric acid aqueous solution L, the precipitation inhibitor and the silicon solution. Also, the etching solution E according to the exemplary embodiment does not necessarily contain the silicon solution.

The substrate processing apparatus 30 is configured to perform an etching processing on a wafer W by immersing the wafer W in the etching solution E produced by the mixing apparatus 10. The wafer W is an example of a substrate. In the exemplary embodiment, it is possible to selectively etch, between a silicon nitride film (SiN) and a silicon dioxide film ($SiO_2$) formed on the wafer W, for example, the silicon nitride film.

The mixing apparatus 10 includes a phosphoric acid aqueous solution supply 11, a precipitation inhibitor supply 12, a silicon solution supply 13, a tank 14 and a circulation path 15. The precipitation inhibitor supply 12 is an example of an additive supply.

The phosphoric acid aqueous solution supply 11 supplies the phosphoric acid aqueous solution L into the tank 14. The phosphoric acid aqueous solution supply 11 is equipped with a phosphoric acid aqueous solution source 11*a*, a phosphoric acid aqueous solution supply path 11*b* and a flow rate controller 11*c*.

The phosphoric acid aqueous solution source 11*a* is, for example, a tank that stores the phosphoric acid aqueous solution L. The phosphoric acid aqueous solution supply path 11*b* connects the phosphoric acid aqueous solution source 11*a* and the tank 14, and supplies the phosphoric acid aqueous solution L from the phosphoric acid aqueous solution source 11*a* into the tank 14.

The flow rate controller 11*c* is provided at the phosphoric acid aqueous solution supply path 11*b* and controls a flow rate of the phosphoric acid aqueous solution L to be supplied into the tank 14. The flow rate controller 11*c* is composed of an opening/closing valve, a flow rate control valve, a flowmeter and the like.

The precipitation inhibitor supply 12 supplies the precipitation inhibitor into the tank 14. The precipitation inhibitor supply 12 is equipped with a precipitation inhibitor source 12*a*, a precipitation inhibitor supply path 12*b* and a flow rate controller 12*c*. The precipitation inhibitor supply path 12*b* is an example of an additive supply path.

The precipitation inhibitor source 12*a* is, for example, a tank that stores the precipitation inhibitor. The precipitation inhibitor supply path 12*b* connects the precipitation inhibitor source 12*a* and the tank 14 and supplies the precipitation inhibitor from the precipitation inhibitor source 12*a* into the tank 14.

Further, the precipitation inhibitor supply path 12*b* is equipped with a precipitation inhibitor supply opening 12*d* at an outlet thereof. The precipitation inhibitor supply opening 12*d* is an example of an additive supply opening. Furthermore, the precipitation inhibitor is discharged from the precipitation inhibitor supply opening 12*d* onto a liquid surface La of the phosphoric acid aqueous solution L stored in the tank 14.

The flow rate controller 12*c* is provided at the precipitation inhibitor supply path 12*b* and controls a flow rate of the precipitation inhibitor to be supplied into the tank 14. The flow rate controller 12*c* is composed of an opening/closing valve, a flow rate control valve, a flowmeter and the like.

The precipitation inhibitor according to the exemplary embodiment just needs to contain a component for suppressing the precipitation of silicon oxide. For example, the precipitation inhibitor may contain a component configured to suppress the precipitation of silicon oxide by stabilizing silicon ions dissolved in the phosphoric acid aqueous solution L. Also, the precipitation inhibitor may contain a component configured to suppress the precipitation of silicon oxide by other known methods.

Examples of the precipitation inhibitor according to the exemplary embodiment may include hexafluorosilicic acid ($H_2SiF_6$) aqueous solution containing fluorine. Further, the precipitation inhibitor may contain an additive such as ammonia in order to stabilize hexafluorosilicic acid in the aqueous solution.

Examples of the precipitation inhibitor according to the exemplary embodiment may include ammonium hexafluorosilicate ($(NH_4)_2SiF_6$) or sodium hexafluorosilicate ($Na_2SiF_6$).

The precipitation inhibitor according to the exemplary embodiment may be a compound containing cations having an ionic radius of from 0.2 Å to 0.9 Å. Herein, the term "ionic radius" refers to the radius of an ion calculated by experience from the sum of the radiuses of anions and cations obtained from a lattice constant of a crystal lattice.

The precipitation inhibitor according to the exemplary embodiment may contain an oxide of at least one element of, for example, aluminum, potassium, lithium, sodium, magnesium, calcium, zirconium, tungsten, titanium, molybdenum, hafnium, nickel and chromium.

Further, the precipitation inhibitor according to the exemplary embodiment may contain at least one of a nitride, a chloride, a bromide, a hydroxide and a nitrate of any one of the above-described elements instead of or in addition to an oxide of any one of the above-described elements.

The precipitation inhibitor according to the exemplary embodiment may contain at least one of, for example, $Al(OH)_3$, $AlCl_3$, $AlBr_3$, $Al(NO_3)_3$, $Al_2(SO_4)_3$, $AlPO_4$ and $Al_2O_3$.

Further, the precipitation inhibitor according to the exemplary embodiment may contain at least one of KCl, KBr, KOH and $KNO_3$. Furthermore, the precipitation inhibitor according to the exemplary embodiment may contain at least one of LiCl, NaCl, $MgCl_2$, $CaCl_2$ and $ZrCl_4$.

The silicon solution supply 13 supplies the silicon solution into the tank 14. The silicon solution according to the exemplary embodiment is, for example, a solution in which colloidal silicon is dispersed. The silicon solution supply 13 is equipped with a silicon solution source 13*a*, a silicon solution supply path 13*b* and a flow rate controller 13*c*.

The silicon solution source 13*a* is, for example, a tank that stores the silicon solution. The silicon solution supply path 13*b* connects the silicon solution source 13*a* and the tank 14 and supplies the silicon solution from the silicon solution source 13*a* into the tank 14.

The flow rate controller 13*c* is provided at the silicon solution supply path 13*b* and controls a flow rate of the silicon solution to be supplied into the tank 14. The flow rate controller 13*c* is composed of an opening/closing valve, a flow rate control valve, a flowmeter and the like.

The tank 14 stores the phosphoric acid aqueous solution L supplied from the phosphoric acid aqueous solution supply 11, the precipitation inhibitor supplied from the precipitation inhibitor supply 12 and the silicon solution supplied from the silicon solution supply 13. Also, the tank 14 stores the etching solution E produced by mixing the phosphoric acid aqueous solution L, the precipitation inhibitor and the silicon solution.

The circulation path 15 is a circulation line that comes out of the tank 14 and returns to the tank 14. The circulation path 15 has an inlet 15*a* provided at a lower portion of the tank 14 and an outlet 15*b* provided at an upper portion of the tank 14 and forms a circulation flow flowing from the inlet 15*a* toward the outlet 15*b*. Further, in the exemplary embodiment, the outlet 15*b* is placed above the liquid surface La of the phosphoric acid aqueous solution L stored in the tank 14.

The circulation path 15 is equipped with a pump 16, a heater 17, an opening/closing valve 18, a filter 19 and a branch portion 15*c* that are provided in sequence from an upstream side of the tank 14. Further, a solution sending path 22 through which the etching solution E is sent to a processing tank 31 of the substrate processing apparatus 30 is branched from the branch portion 15*c*.

The pump 16 forms a circulation flow of the phosphoric acid aqueous solution L that starts from the tank 14 and returns to the tank 14 through the circulation path 15.

The heater 17 heats the phosphoric acid aqueous solution L circulating in the circulation path 15. In the exemplary embodiment, by heating the phosphoric acid aqueous solution L, the heater 17 heats the phosphoric acid aqueous solution L stored in the tank 14.

The filter 19 removes contaminants such as particles contained in the etching solution E circulating in the circulation path 15. Further, the circulation path 15 is equipped with a bypass flow path 20 that bypasses the filter 19, and the bypass flow path 20 is equipped with an opening/closing valve 21.

By alternately opening and closing the opening/closing valve 18 provided at the circulation path 15 and the opening/closing valve 21 provided at the bypass flow path 20, it is possible to form any one of a circulation flow flowing through the filter 19 and a circulation flow bypassing the filter 19.

In the exemplary embodiment, to efficiently mix the phosphoric acid aqueous solution L and the precipitation inhibitor, the precipitation inhibitor is supplied while fluidity is imparted to the phosphoric acid aqueous solution L. For example, in the exemplary embodiment, the pump 16 is operated to form the circulation flow in the circulation path 15, and, thus, fluidity is imparted to the phosphoric acid aqueous solution L.

As such, since the precipitation inhibitor is supplied while fluidity is imparted to the phosphoric acid aqueous solution L, a contact area between the phosphoric acid aqueous solution L and the precipitation inhibitor can be increased. Therefore, according to the exemplary embodiment, it is possible to efficiently mix the phosphoric acid aqueous solution L and the precipitation inhibitor.

Further, in the exemplary embodiment, the precipitation inhibitor supply opening 12*d* through which the precipitation inhibitor is supplied from the precipitation inhibitor supply path 12*b* into the tank 14 just needs to be provided adjacent to the outlet 15*b* of the circulation path 15. Thus, the precipitation inhibitor can be directly supplied to the phosphoric acid aqueous solution L that has been discharged from the outlet 15*b* to have high fluidity.

Therefore, according to the exemplary embodiment, the contact area between the phosphoric acid aqueous solution L and the precipitation inhibitor can be further increased, and, thus, it is possible to more efficiently mix the phosphoric acid aqueous solution L and the precipitation inhibitor.

Figure 2:
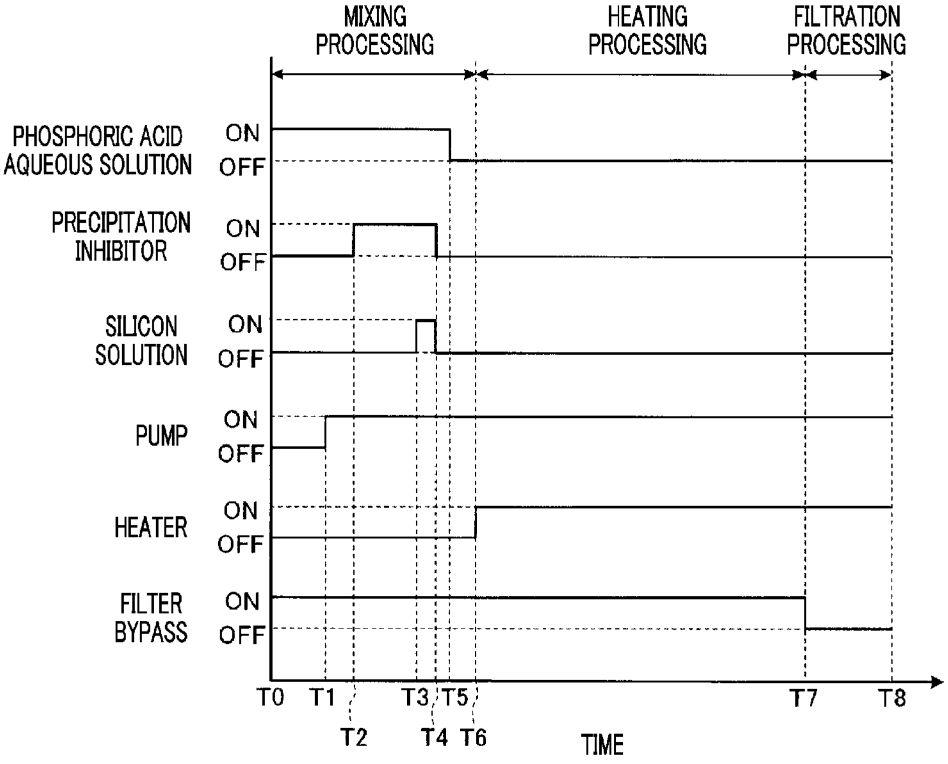
FIG. 2 is a timing chart illustrating an example of operation patterns of respective components of a mixing apparatus in an etching solution production processing according to the exemplary embodiment.

Details of an etching solution production processing performed by the mixing apparatus 10 will be described with reference to FIG. 2. FIG. 2 is a timing chart illustrating an example of operation patterns of respective components of the mixing apparatus 10 in the etching solution production processing according to the exemplary embodiment. Also, the components of the mixing apparatus 10 are controlled by a controller (not illustrated) provided in the substrate processing system 1.

The controller controls the operations of the respective components (the mixing apparatus 10, the substrate processing apparatus 30 and the like) of the substrate processing system 1 illustrated in FIG. 1. The controller controls the operations of the respective components of the substrate processing system 1 based on signals from a switch and various sensors.

The controller is, for example, a computer and includes a computer-readable recording medium (not illustrated). The recording medium stores therein a program for controlling various processings performed by the substrate processing system 1.

The controller controls the operations of the substrate processing system 1 by reading the program stored in the recording medium and executing the program. The program may be recorded in a computer-readable recording medium and may be installed into the recording medium of the controller from other recording medium.

The computer-readable recording medium includes, for example, a hard disk (HD), a flexible disk (FD), a compact disk (CD), a magneto-optical disk (MO), and a memory card.

As illustrated in FIG. 2, in the etching solution production processing according to the exemplary embodiment, a mixing processing, a heating processing and a filtration processing are sequentially performed. First, the controller starts the mixing processing by operating the phosphoric acid aqueous solution supply 11 (ON state) from a time point T0 to supply the phosphoric acid aqueous solution L into the tank 14.

At the time point T0, the precipitation inhibitor supply 12, the silicon solution supply 13, the pump 16 and the heater 17 do not operate (OFF state). Also, at the time point T0, the opening/closing valve 18 is closed and the opening/closing valve 21 is opened, and, thus, the filter 19 is in a bypass state (a filter bypass is in an ON state) on the bypass flow path 20.

Then, at a time point T1 when a predetermined amount of the phosphoric acid aqueous solution L is stored in the tank 14, the controller operates the pump 16 (ON state) to form the circulation flow in the circulation path 15. Thus, it is possible to impart fluidity to the phosphoric acid aqueous solution L stored in the tank 14.

Also, by operating the pump 16 after the predetermined amount of the phosphoric acid aqueous solution L is stored in the tank 14, it is possible to suppress air from being mixed into the circulation path 15 and the occurrence of trouble in the pump 16.

Then, at a time point T2 when a predetermined time has elapsed from the time point T1 and fluidity is imparted sufficiently to the phosphoric acid aqueous solution L, the controller operates the precipitation inhibitor supply 12 (ON state) to supply the precipitation inhibitor into the tank 14.

Accordingly, the precipitation inhibitor can be mixed with the phosphoric acid aqueous solution L to which fluidity is imparted sufficiently, and, thus, it is possible to efficiently mix the phosphoric acid aqueous solution L and the precipitation inhibitor.

Further, in the exemplary embodiment, the precipitation inhibitor just needs to be supplied to be diffused on the liquid surface La of the phosphoric acid aqueous solution L flowing in the tank 14. That is, in the exemplary embodiment, the precipitation inhibitor just needs to be supplied a little at a time according to the fluidity of the phosphoric acid aqueous solution L. In other words, in the exemplary embodiment, the amount of the precipitation inhibitor to be supplied just needs to be set based on the fluidity of the phosphoric acid aqueous solution L.

Thus, it is possible to suppress a concentration of the precipitation inhibitor in the phosphoric acid aqueous solution L from being locally increased. Therefore, according to the exemplary embodiment, it is possible to suppress the gelation of the precipitation inhibitor caused as the concentration of the precipitation inhibitor is locally increased.

Then, at a time point T3 when a predetermined time has elapsed from the time point T2, the controller operates the silicon solution supply 13 (ON state) to supply the silicon solution into the tank 14. Then, at a time point T4 when predetermined amounts of the precipitation inhibitor and the silicon solution have been supplied into the tank 14, the controller stops the precipitation inhibitor supply 12 and the silicon solution supply 13 (OFF state).

Thereafter, at a time point T5 when a predetermined amount of the phosphoric acid aqueous solution L has been supplied into the tank 14, the controller stops the phosphoric acid aqueous solution supply 11 (OFF state). Then, the circulation flow is formed in the circulation path 15 to mix the chemical liquid in the tank 14 until a time point T6, and, thus, the mixing processing is completed.

Although FIG. 2 illustrates an example where the silicon solution starts to be supplied later than the precipitation inhibitor, the supply of the precipitation inhibitor and the supply of the silicon solution may start at the same timing (time point T2).

Then, the controller starts the heating processing by operating the heater 17 (ON state) from the time point T6 to heat the etching solution E circulating in the circulation path 15. The controller heats the etching solution E stored in the tank 14 by heating the etching solution E with the heater 17.

Further, when a liquid amount of the phosphoric acid aqueous solution L or the precipitation inhibitor is weighed with a liquid surface sensor (not illustrated) provided in the tank 14, a temperature change of the stored phosphoric acid aqueous solution L may have a bad influence on the accuracy in the weighing.

Therefore, in the exemplary embodiment, the heating processing starts from a time point (time point T6) when the weighing of each chemical liquid has been completed and the mixing processing has been completed. Thus, the accuracy in the weighing of each chemical liquid can be well maintained.

Then, at a time point T7 when the etching solution E in the tank 14 has been heated to a predetermined temperature (e.g., 165° C.), the heating processing is completed. As such, in the exemplary embodiment, the heater 17 that performs the heating processing is provided in the mixing apparatus 10, and, thus, the heated etching solution E can be supplied into the substrate processing apparatus 30.

Further, in the exemplary embodiment, the heater 17 is provided at the circulation path 15 of the mixing apparatus 10, and, thus, the etching solution E can be heated efficiently.

Furthermore, in the etching solution production processing according to the exemplary embodiment, the heating processing starts after the mixing processing is completed. This is because, if the precipitation inhibitor containing an organic solvent is supplied to the phosphoric acid aqueous solution L whose temperature is increased by being heated, the precipitation inhibitor may bump.

That is, according to the exemplary embodiment, the heating processing starts after the mixing processing is completed, and, thus, it is possible to suppress the bumping of the precipitation inhibitor during the supply of the precipitation inhibitor.

Likewise, if the silicon solution containing water is supplied to the phosphoric acid aqueous solution L whose temperature is increased by being heated, the silicon solution may bump. That is, according to the exemplary embodiment, the heating processing starts after the mixing processing is completed, and, thus, it is possible to suppress the bumping of the silicon solution during the supply of the silicon solution.

Then, the controller starts the filtration processing by turning the filter bypass in an OFF state from the time point T7. That is, the controller changes the opening/closing valve 18 to an open state and the opening/closing valve 21 to a closed state from the time point T7 to form the circulation flow flowing in the filter 19 in the circulation path 15. Thus, the contaminants such as particles contained in the etching solution E are removed.

Then, at a time point T8 when the contaminants such as particles contained in the etching solution E have been removed sufficiently, the filtration processing is completed. In this way, the etching solution production processing according to the exemplary embodiment is completed.

Further, in the etching solution production processing according to the exemplary embodiment, the filter bypass is in the ON state during the mixing processing and the heating processing. Accordingly, a pressure loss that occurs in the filter 19 can be reduced in the circulation path 15, and, thus, it is possible to efficiently circulate the phosphoric acid aqueous solution L stored in the tank 14.

Therefore, according to the exemplary embodiment, since the filter bypass is turned in the ON state, it is possible to efficiently impart fluidity to the phosphoric acid aqueous solution L. Also, the filter 19 does not need to filter the phosphoric acid aqueous solution L or the like until the heating processing is completed, and, thus, there is nothing wrong even if the phosphoric acid aqueous solution L is circulated through the bypass flow path 20.

Returning to FIG. 1, other components of the substrate processing system 1 will be described. The substrate processing apparatus 30 performs the etching processing on the wafer W by immersing the wafer W in the etching solution E produced by the mixing apparatus 10.

The substrate processing apparatus 30 includes the processing tank 31, a circulation path 32, a DIW supply 33 and an etching solution drain unit 34. The processing tank 31 is equipped with an inner tank 31*a* and an outer tank 31*b*.

The inner tank 31*a* has an open top, and, thus, the etching solution E is supplied near an upper portion of the inner tank 31*a*. In the inner tank 31*a*, a plurality of wafers W is immersed in the etching solution E by using a substrate elevating mechanism 35 so that the etching processing is performed on the wafers W. The substrate elevating mechanism 35 is configured to be movable up and down and holds the plurality of wafers W arranged back and forth in a standing posture.

The outer tank 31*b* is provided around the upper portion of the inner tank 31*a* and has an open top. The etching solution E overflowing from the inner tank 31*a* is introduced into the outer tank 31*b*. Further, the etching solution E from the mixing apparatus 10 through the solution sending path 22 is supplied into the outer tank 31*b* and deionized water (DIW) from the DIW supply 33 is supplied thereinto.

Furthermore, a flow rate controller 23 is provided at the solution sending path 22. The flow rate controller 23 controls a flow rate of the etching solution E to be supplied into the processing tank 31. The flow rate controller 23 is composed of an opening/closing valve, a flow rate control valve, a flowmeter and the like.

The DIW supply 33 is equipped with a DIW source 33*a*, a DIW supply path 33*b* and a flow rate controller 33*c*. The DIW supply 33 supplies DIW into the outer tank 31*b* to supplement water that has evaporated from the heated etching solution E.

The DIW supply path 33*b* connects the DIW source 33*a* and the outer tank 31*b* and supplies DIW having a predetermined temperature from the DIW source 33*a* into the outer tank 31*b*.

The flow rate controller 33*c* is provided at the DIW supply path 33*b* and controls the amount of DIW to be supplied into the outer tank 31*b*. The flow rate controller 33*c* is composed of an opening/closing valve, a flow rate control valve, a flowmeter and the like. Since the amount of DIW to be supplied is controlled by the flow rate controller 33*c*, the temperature of the etching solution E, the concentration of phosphoric acid, the concentration of silicon and the concentration of the precipitation inhibitor can be controlled.

Further, the outer tank 31*b* is equipped with a temperature sensor 36 and a phosphoric acid concentration sensor 37. The temperature sensor 36 detects the temperature of the etching solution E, and the phosphoric acid concentration sensor 37 detects the concentration of phosphoric acid in the etching solution E. Signals output by the temperature sensor 36 and the phosphoric acid concentration sensor 37 are input to the above-described controller.

The outer tank 31*b* and the inner tank 31*a* are connected by the circulation path 32. One end of the circulation path 32 is connected to a lower portion of the outer tank 31*b* and the other end of the circulation path 32 is connected to a processing liquid supply nozzle 38 provided inside the inner tank 31*a*.

The circulation path 32 is equipped with a pump 39, a heater 40, a filter 41 and a silicon concentration sensor 42 that are provided in sequence from the outer tank 31*b* side.

The pump 39 forms a circulation flow of the etching solution E that is sent from the outer tank 31*b* into the inner tank 31*a* through the circulation path 32. Further, the etching solution E overflows from the inner tank 31*a* into the outer tank 31*b*. As such, the circulation flow of the etching solution E is formed inside the substrate processing apparatus 30. That is, the circulation flow is formed in the outer tank 31*b*, the circulation path 32 and the inner tank 31*a*.

The heater 40 controls the temperature of the etching solution E circulating in the circulation path 32. The filter 41 filters the etching solution E circulating in the circulation path 32. The silicon concentration sensor 42 detects the concentration of silicon in the etching solution E circulating in the circulation path 32. A signal output by the silicon concentration sensor 42 is input to the controller.

When all or some of the etching solution E used in the etching processing is replaced, the etching solution drain unit 34 drains the etching solution E to a drain DR. The etching solution drain unit 34 is equipped with a drain path 34*a*, a flow rate controller 34*b* and a cooling tank 34*c*.

The drain path 34*a* is connected to the circulation path 32. The flow rate controller 34*b* is provided at the drain path 34*a* and controls the amount of the etching solution E to be drained. The flow rate controller 34*b* is composed of an opening/closing valve, a flow rate control valve, a flowmeter and the like.

The cooling tank 34*c* temporarily stores the etching solution E flown through the drain path 34*a* and cools the etching solution E. In the cooling tank 34*c*, the amount of the etching solution E to be drained is controlled by the flow rate controller 34*b*.

Modification Example

Figure 3:
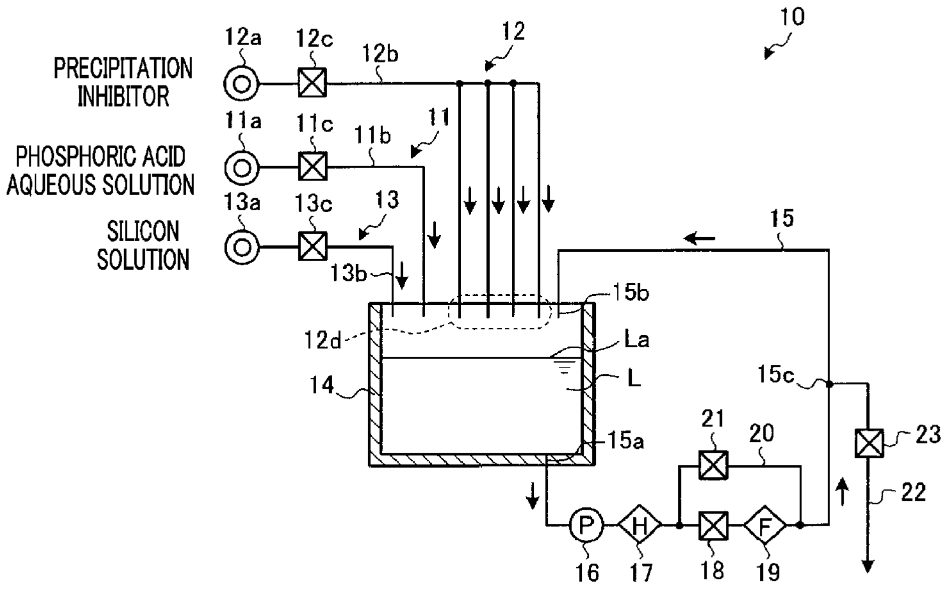
FIG. 3 is a schematic block diagram illustrating a configuration of the mixing apparatus according to a first modification example of the exemplary embodiment.

Hereinafter, various modification examples of the mixing apparatus 10 according to the exemplary embodiment will be described with reference to FIG. 3 to FIG. 18. FIG. 3 is a schematic block diagram illustrating a configuration of the mixing apparatus 10 according to a first modification example of the exemplary embodiment.

In the following modification examples, the same parts will be assigned same reference numerals, and redundant description thereof will be omitted. Further, in the drawings referred to below, a state in which the phosphoric acid aqueous solution L is stored in the tank 14 will be illustrated for easy understanding of the mixing processing.

As illustrated in FIG. 3, the mixing apparatus 10 according to the first modification example is different in the configuration of the precipitation inhibitor supply path 12*b* of the precipitation inhibitor supply 12 from the exemplary embodiment. Specifically, the precipitation inhibitor supply path 12*b* is branched into a plurality of flow paths.

Further, in the first modification example, the precipitation inhibitor supply opening 12*d* is divided into a plurality of parts in a horizontal direction at the upper portion of the tank 14. That is, in the first modification example, a plurality of precipitation inhibitor supply openings 12*d* is provided at different locations, respectively, in the horizontal direction.

Further, in the present disclosure, the term "upper portion of the tank 14" refers to the upper side from the center in a height direction of the tank 14 and the term "lower portion of the tank 14" refers to the lower side from the center in the height direction of the tank 14.

In the first modification example, the precipitation inhibitor supply 12 divides the precipitation inhibitor to a plurality of points by using the plurality of precipitation inhibitor supply openings 12*d* and supplies the precipitation inhibitor onto the liquid surface La of the stored phosphoric acid aqueous solution L. Thus, the contact area between the phosphoric acid aqueous solution L and the precipitation inhibitor can be increased. Therefore, according to the first modification example, it is possible to more efficiently mix the phosphoric acid aqueous solution L and the precipitation inhibitor.

Further, in the first modification example, the precipitation inhibitor is divided to the plurality of points and supplied to the phosphoric acid aqueous solution L, and, thus, it is possible to suppress the concentration of the precipitation inhibitor in the phosphoric acid aqueous solution L from being locally increased. Therefore, it is possible to suppress the gelation of the precipitation inhibitor caused as the concentration of the precipitation inhibitor is locally increased.

Therefore, according to the first modification example, the precipitation inhibitor that is in good condition without being gelated can be mixed with the phosphoric acid aqueous solution L. Although FIG. 3 illustrates an example where the precipitation inhibitor supply path 12*b* is branched into four flow paths, the number of flow paths to be branched is not limited to four.

Further, in the first modification example, the precipitation inhibitor just needs to be supplied to be diffused on the liquid surface La of the phosphoric acid aqueous solution L flowing in the tank 14. That is, in the first modification example, the precipitation inhibitor just needs to be supplied a little at a time according to the fluidity of the phosphoric acid aqueous solution L. In other words, in the first modification example, the amount of the precipitation inhibitor to be supplied just needs to be set based on the fluidity of the phosphoric acid aqueous solution L.

Accordingly, since it is possible to further suppress the concentration of the precipitation inhibitor in the phosphoric acid aqueous solution L from being locally increased, it is possible to further suppress the gelation of the precipitation inhibitor.

Figure 4:
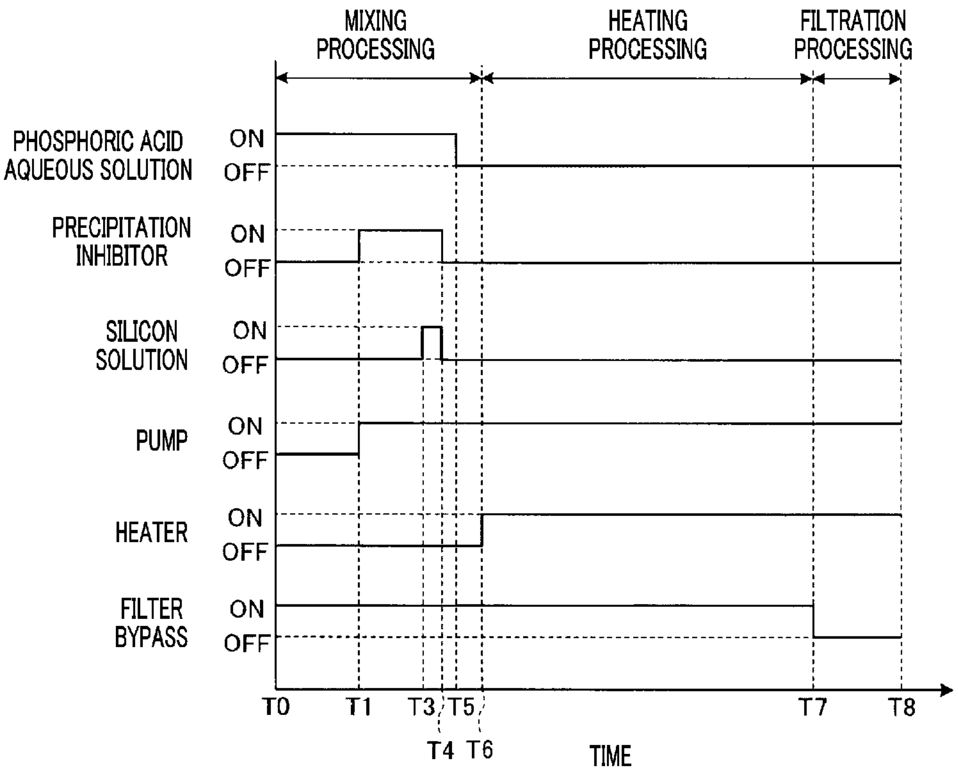
FIG. 4 is a timing chart illustrating an example of operation patterns of respective components of the mixing apparatus in an etching solution production processing according to the first modification example of the exemplary embodiment.

FIG. 4 is a timing chart illustrating an example of operation patterns of respective components of the mixing apparatus 10 in the etching solution production processing according to the first modification example of the exemplary embodiment. As illustrated in FIG. 4, the etching solution production processing according to the first modification example is different in the supply timing of the precipitation inhibitor from the exemplary embodiment.

Specifically, in the first modification example, after the mixing processing starts at the time point T0, the supply of the precipitation inhibitor starts at the same timing as the pump 16 is operated (time point T1). The following processings are the same as those of the exemplary embodiment, and, thus, a detailed description thereof will be omitted.

Figure 5:
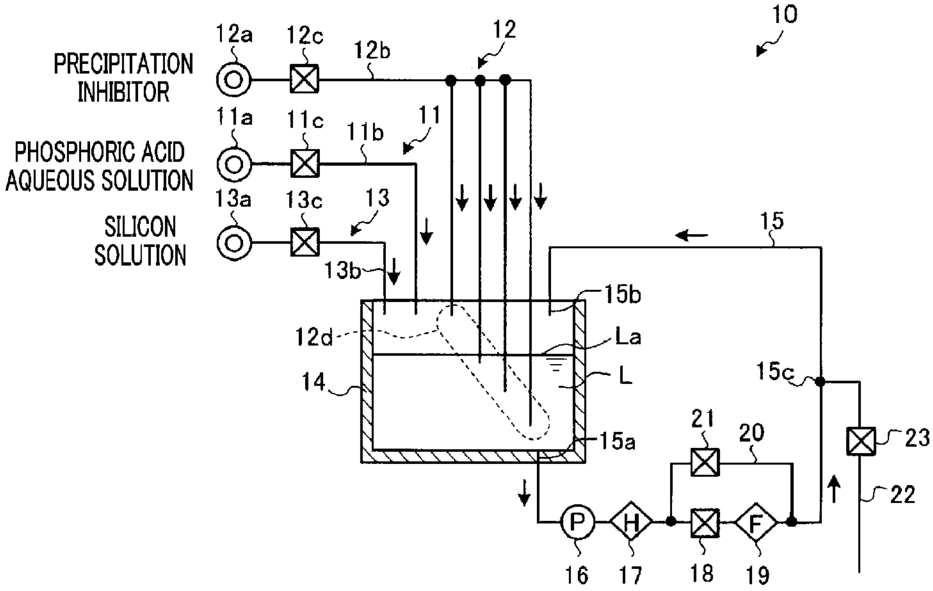
FIG. 5 is a schematic block diagram illustrating a configuration of the mixing apparatus according to a second modification example of the exemplary embodiment.

FIG. 5 is a schematic block diagram illustrating a configuration of the mixing apparatus 10 according to a second modification example of the exemplary embodiment. As illustrated in FIG. 5, the mixing apparatus 10 according to the second modification example is different in the arrangement of the plurality of precipitation inhibitor supply openings 12*d* from the first modification example.

Specifically, the plurality of precipitation inhibitor supply openings 12*d* is arranged to be divided in the height direction as well as in the horizontal direction. In other words, in the second modification example, the plurality of precipitation inhibitor supply openings 12*d* is provided at different locations, respectively, in the horizontal direction and the height direction.

Accordingly, since the precipitation inhibitor can be supplied to a plurality of points in a wider range, it is possible to more efficiently mix the phosphoric acid aqueous solution L and the precipitation inhibitor.

Also, in the second modification example, the precipitation inhibitor can be supplied onto the liquid surface La of the stored phosphoric acid aqueous solution L as well as into the phosphoric acid aqueous solution L. Further, since the precipitation inhibitor according to the exemplary embodiment contains the organic solvent, it has a smaller specific gravity than the phosphoric acid aqueous solution L.

Therefore, as in the second modification example, the precipitation inhibitor is supplied into the phosphoric acid aqueous solution L, and, thus, it is possible to suppress the precipitation inhibitor from staying only on the liquid surface La of the phosphoric acid aqueous solution L.

That is, in the second modification example, the precipitation inhibitor is supplied into the phosphoric acid aqueous solution L, and, thus, it is possible to suppress the concentration of the precipitation inhibitor on the liquid surface La from being locally increased to suppress the gelation of the precipitation inhibitor. Therefore, according to the second modification example, the precipitation inhibitor that is in good condition without being gelated can be mixed with the phosphoric acid aqueous solution L.

Further, in the second modification example, the precipitation inhibitor just needs to be supplied into the phosphoric acid aqueous solution L flowing in the tank 14 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor.

Also, the etching solution production processing according to the second modification example just needs to be performed according to the timing chart as illustrated in FIG. 4.

Figure 6:
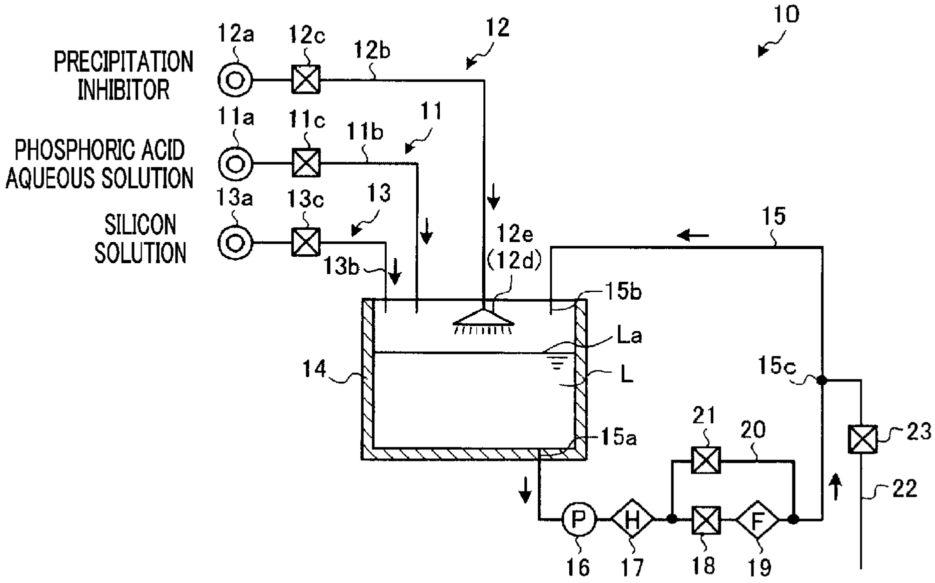
FIG. 6 is a schematic block diagram illustrating a configuration of the mixing apparatus according to a third modification example of the exemplary embodiment.

FIG. 6 is a schematic block diagram illustrating a configuration of the mixing apparatus 10 according to a third modification example of the exemplary embodiment. As illustrated in FIG. 6, the mixing apparatus 10 according to the third modification example is equipped with a shower nozzle 12*e* at the precipitation inhibitor supply opening 12*d*. The shower nozzle 12*e* is provided at the upper portion of the tank 14 and supplies the precipitation inhibitor onto the liquid surface La of the phosphoric acid aqueous solution L.

In the third modification example, the shower nozzle 12*e* supplies the precipitation inhibitor so as to be thinly diffused on the liquid surface La of the stored phosphoric acid aqueous solution L. Thus, the contact area between the phosphoric acid aqueous solution L and the precipitation inhibitor can be further increased. Therefore, according to the third modification example, it is possible to more efficiently mix the phosphoric acid aqueous solution L and the precipitation inhibitor.

Further, in the third modification example, the precipitation inhibitor is supplied by the shower nozzle 12*e* to the phosphoric acid aqueous solution L so as to be thinly diffused, and, thus, it is possible to suppress the concentration of the precipitation inhibitor in the phosphoric acid aqueous solution L from being locally increased.

Therefore, according to the third modification example, it is possible to suppress the gelation of the precipitation inhibitor when the precipitation inhibitor is supplied to the phosphoric acid aqueous solution L.

Furthermore, in the third modification example, the precipitation inhibitor just needs to be supplied to be diffused on the liquid surface La of the phosphoric acid aqueous solution L flowing in the tank 14. That is, in the third modification example, the precipitation inhibitor just needs to be supplied a little at a time according to the fluidity of the phosphoric acid aqueous solution L. In other words, in the third modification example, the amount of the precipitation inhibitor to be supplied just needs to be set based on the fluidity of the phosphoric acid aqueous solution L.

Accordingly, since it is possible to further suppress the concentration of the precipitation inhibitor in the phosphoric acid aqueous solution L from being locally increased, it is possible to further suppress the gelation of the precipitation inhibitor.

Also, the etching solution production processing according to the third modification example just needs to be performed according to the timing chart as illustrated in FIG. 4. Further, the shower nozzle 12*e* is provided at the upper portion of the tank 14, but may be provided at the lower portion of the tank 14. Furthermore, the precipitation inhibitor may be supplied from the shower nozzle 12*e* provided at the lower portion of the tank 14 into the stored phosphoric acid aqueous solution L.

Figure 7:
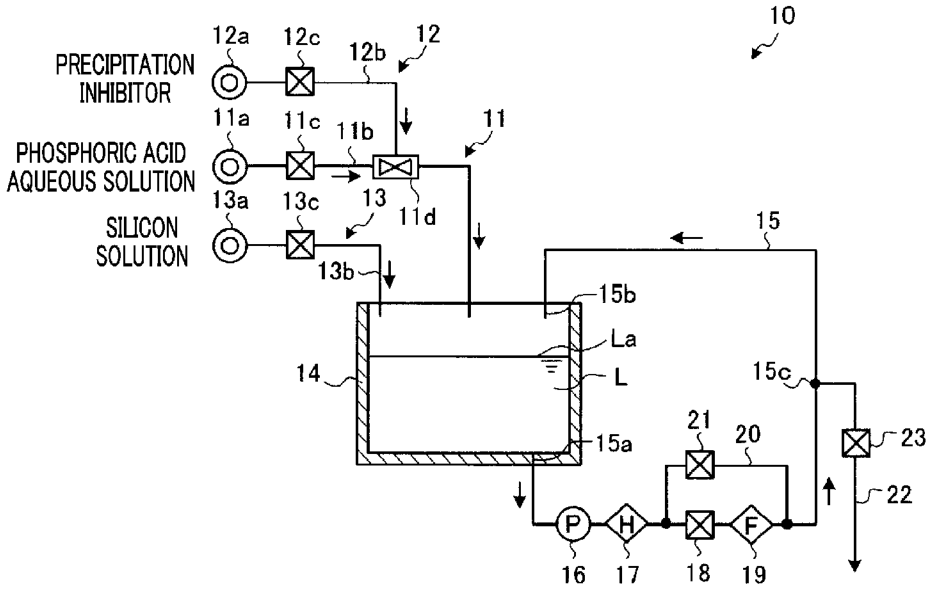
FIG. 7 is a schematic block diagram illustrating a configuration of the mixing apparatus according to a fourth modification example of the exemplary embodiment.

FIG. 7 is a schematic block diagram illustrating a configuration of the mixing apparatus 10 according to a fourth modification example of the exemplary embodiment. As illustrated in FIG. 7, the mixing apparatus 10 according to the fourth modification example is equipped with a mixer 11*d* on the phosphoric acid aqueous solution supply path 11*b*. The mixer 11*d* is, for example, an inline mixer or a static mixer.

The precipitation inhibitor supply 12 supplies the precipitation inhibitor into the mixer 11*d*. Thus, it is possible to supply the precipitation inhibitor to the phosphoric acid aqueous solution L to which high fluidity is imparted by the mixer 11*d*.

Therefore, according to the fourth modification example, it is possible to more efficiently mix the phosphoric acid aqueous solution L and the precipitation inhibitor.

Further, in the fourth modification example, the precipitation inhibitor just needs to be supplied into the phosphoric acid aqueous solution L flowing in the phosphoric acid aqueous solution supply path 11*b* so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the fourth modification example just needs to be performed according to the timing chart as illustrated in FIG. 4.

Figure 8:
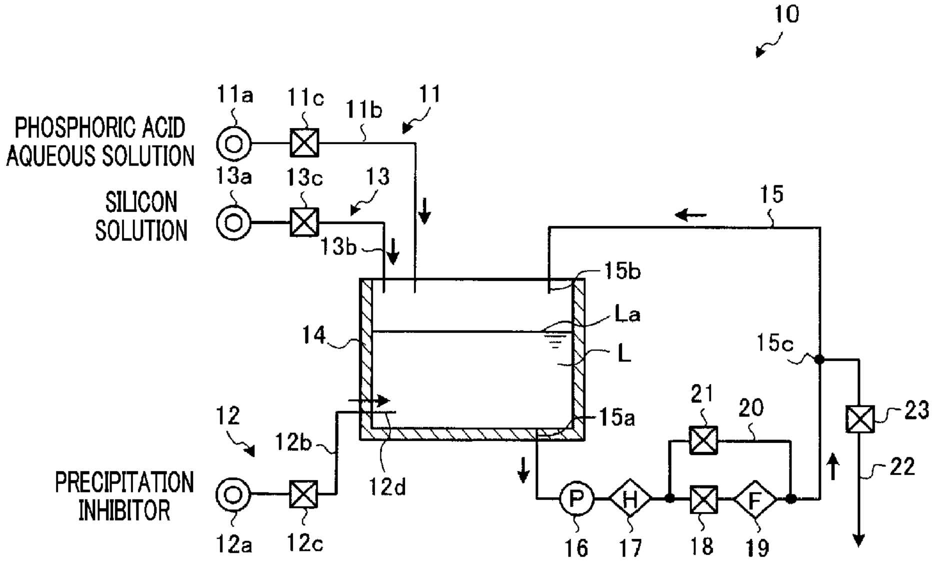
FIG. 8 is a schematic block diagram illustrating a configuration of the mixing apparatus according to a fifth modification example of the exemplary embodiment.

FIG. 8 is a schematic block diagram illustrating a configuration of the mixing apparatus 10 according to a fifth modification example of the exemplary embodiment. As illustrated in FIG. 8, the mixing apparatus 10 according to the fifth modification example is equipped with the precipitation inhibitor supply opening 12*d* of the precipitation inhibitor supply 12 at the lower portion of the tank 14. Further, the precipitation inhibitor is supplied into the phosphoric acid aqueous solution L from the precipitation inhibitor supply opening 12*d*.

Accordingly, since it is possible to suppress the precipitation inhibitor from staying only on the liquid surface La of the phosphoric acid aqueous solution L, it is possible to suppress the concentration of the precipitation inhibitor on the liquid surface La from being locally increased and suppress the gelation of the precipitation inhibitor.

Therefore, according to the fifth modification example, the precipitation inhibitor that is in good condition without being gelated can be mixed with the phosphoric acid aqueous solution L.

Further, in the fifth modification example, the precipitation inhibitor just needs to be supplied into the phosphoric acid aqueous solution L flowing in the tank 14 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the fifth modification example just needs to be performed according to the timing chart as illustrated in FIG. 2.

Figure 9:
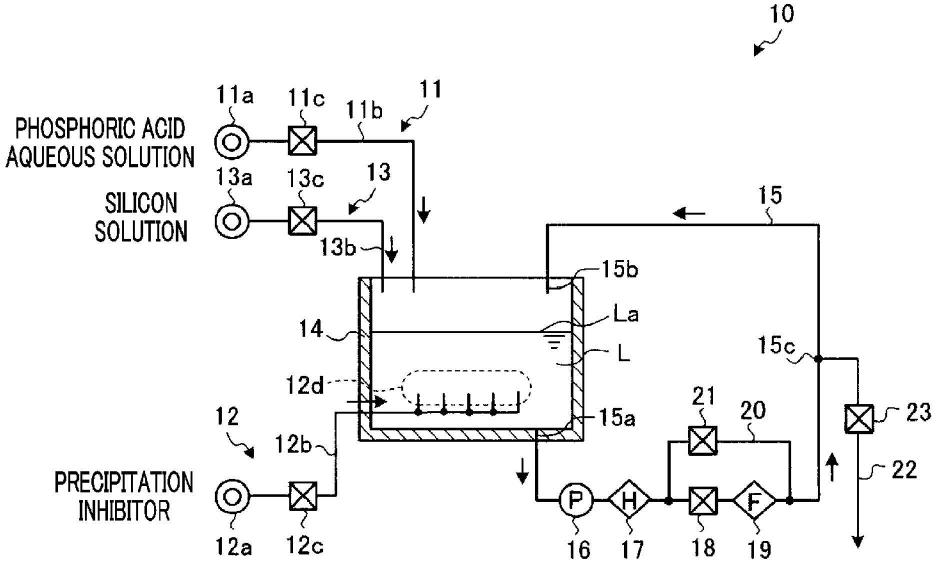
FIG. 9 is a schematic block diagram illustrating a configuration of the mixing apparatus according to a sixth modification example of the exemplary embodiment.

FIG. 9 is a schematic block diagram illustrating a configuration of the mixing apparatus 10 according to a sixth modification example of the exemplary embodiment. As illustrated in FIG. 9, the mixing apparatus 10 according to the sixth modification example is different in the configuration of the precipitation inhibitor supply path 12*b* of the precipitation inhibitor supply 12 from the fifth modification example.

Specifically, the precipitation inhibitor supply path 12*b* is branched into a plurality of flow paths and the precipitation inhibitor supply opening 12*d* is arranged to be divided into a plurality of parts in the horizontal direction at the lower portion of the tank 14. Further, in the sixth modification example, the precipitation inhibitor is divided to a plurality of points by a plurality of precipitation inhibitor supply openings 12*d* to be supplied into the stored phosphoric acid aqueous solution L.

Thus, the contact area between the phosphoric acid aqueous solution L and the precipitation inhibitor can be increased. Therefore, it is possible to more efficiently mix the phosphoric acid aqueous solution L and the precipitation inhibitor.

Further, in the sixth modification example, since it is possible to suppress the precipitation inhibitor from staying only on the liquid surface La of the phosphoric acid aqueous solution L, it is possible to suppress the concentration of the precipitation inhibitor on the liquid surface La from being locally increased and suppress the gelation of the precipitation inhibitor.

Therefore, according to the sixth modification example, the precipitation inhibitor that is in good condition without being gelated can be mixed with the phosphoric acid aqueous solution L.

Furthermore, in the sixth modification example, the precipitation inhibitor just needs to be supplied into the phosphoric acid aqueous solution L flowing in the tank 14 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor.

Also, the etching solution production processing according to the sixth modification example just needs to be performed according to the timing chart as illustrated in FIG. 2. Although FIG. 9 illustrates an example where the precipitation inhibitor supply path 12*b* is branched into five flow paths, the number of flow paths to be branched is not limited to five.

Figure 10:
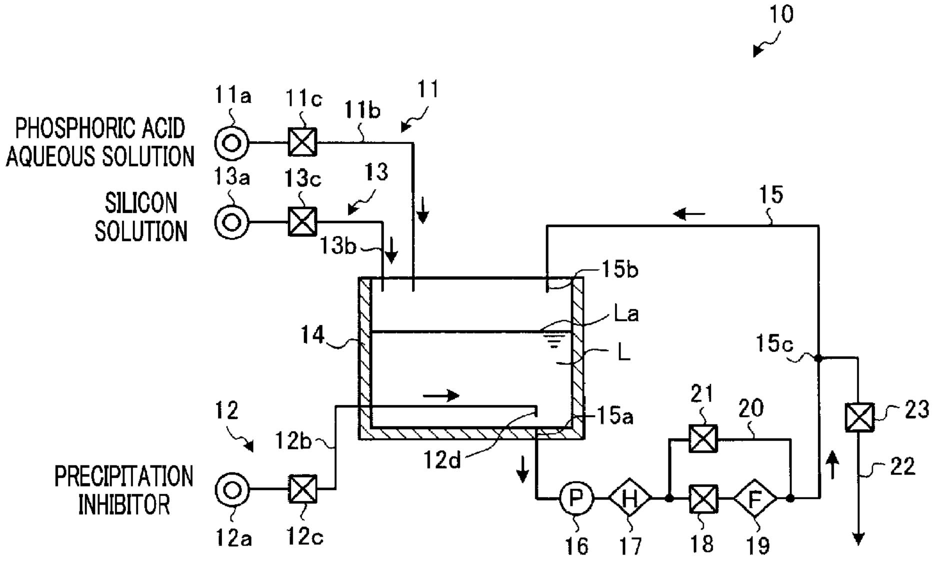
FIG. 10 is a schematic block diagram illustrating a configuration of the mixing apparatus according to a seventh modification example of the exemplary embodiment.

FIG. 10 is a schematic block diagram illustrating a configuration of the mixing apparatus 10 according to a seventh modification example of the exemplary embodiment. As illustrated in FIG. 10, the mixing apparatus 10 according to the seventh modification example is equipped with the precipitation inhibitor supply opening 12*d* of the precipitation inhibitor supply 12 that is provided adjacent to the inlet 15*a* of the circulation path 15 at the lower portion of the tank 14. Further, the precipitation inhibitor is supplied toward the inlet 15*a* of the circulation path 15 from the precipitation inhibitor supply opening 12*d*.

Accordingly, since it is possible to suppress the precipitation inhibitor from staying only on the liquid surface La of the phosphoric acid aqueous solution L, it is possible to suppress the concentration of the precipitation inhibitor on the liquid surface La from being locally increased and suppress the gelation of the precipitation inhibitor. Therefore, according to the seventh modification example, the precipitation inhibitor that is in good condition without being gelated can be mixed with the phosphoric acid aqueous solution L.

Further, in the seventh modification example, the precipitation inhibitor is rapidly supplied to the circulation path 15. Thus, it is possible to supply the precipitation inhibitor to the phosphoric acid aqueous solution L, to which high fluidity is imparted, inside the circulation path 15. Therefore, according to the seventh modification example, it is possible to more efficiently mix the phosphoric acid aqueous solution L and the precipitation inhibitor.

Furthermore, in the seventh modification example, an influence of pulsation of the pump 16 on the precipitation inhibitor supply 12 can be reduced. Therefore, according to the seventh modification example, it is possible to improve the supplying accuracy of the precipitation inhibitor from the precipitation inhibitor supply 12.

Moreover, in the seventh modification example, the precipitation inhibitor just needs to be supplied into the phosphoric acid aqueous solution L flowing in the tank 14 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the seventh modification example just needs to be performed according to the timing chart as illustrated in FIG. 2.

Figure 11:
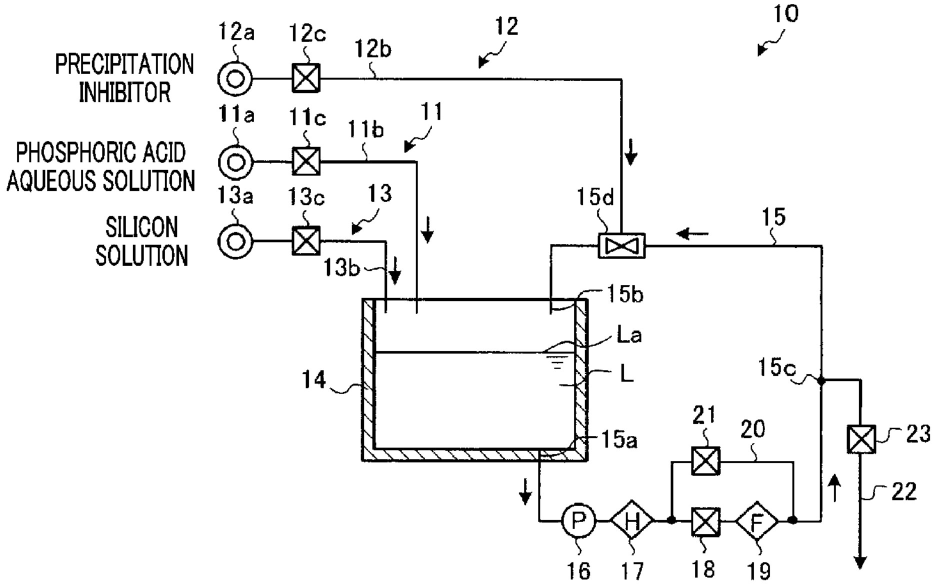
FIG. 11 is a schematic block diagram illustrating a configuration of the mixing apparatus according to an eighth modification example of the exemplary embodiment.

FIG. 11 is a schematic block diagram illustrating a configuration of the mixing apparatus 10 according to an eighth modification example of the exemplary embodiment. As illustrated in FIG. 11, the mixing apparatus 10 according to the eighth modification example is equipped with a mixer 15*d* on a more downstream side of the circulation path 15 than the branch portion 15*c*. The mixer 15*d* is, for example, an inline mixer or a static mixer.

The precipitation inhibitor supply 12 supplies the precipitation inhibitor into the mixer 15*d*. Thus, it is possible to supply the precipitation inhibitor to the phosphoric acid aqueous solution L to which fluidity is imparted by the pump 16 and further imparted by the mixer 15*d*. Therefore, according to the eighth modification example, it is possible to more efficiently mix the phosphoric acid aqueous solution L and the precipitation inhibitor.

Further, in the eighth modification example, the mixer 15*d* is provided at a more downstream side of the circulation path 15 than the pump 16 and the filter 19. Thus, even if the precipitation inhibitor is gelated, it is possible to suppress the gelated precipitation inhibitor from being deposited in the pump 16 and the filter 19.

Furthermore, in the eighth modification example, the precipitation inhibitor just needs to be supplied into the phosphoric acid aqueous solution L flowing in the circulation path 15 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the eighth modification example just needs to be performed according to the timing chart as illustrated in FIG. 2.

Figure 12:
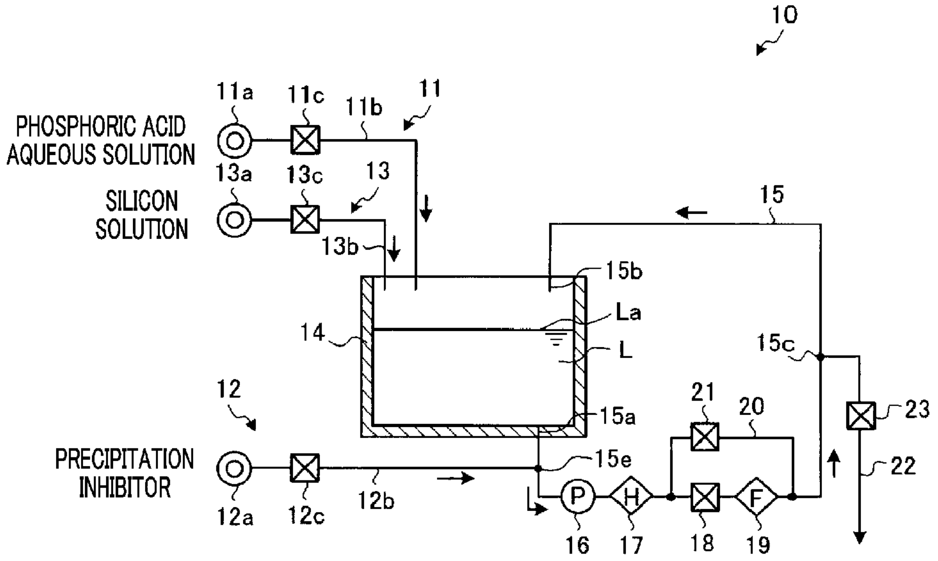
FIG. 12 is a schematic block diagram illustrating a configuration of the mixing apparatus according to a ninth modification example of the exemplary embodiment.

FIG. 12 is a schematic block diagram illustrating a configuration of the mixing apparatus 10 according to a ninth modification example of the exemplary embodiment. As illustrated in FIG. 12, the mixing apparatus 10 according to the ninth modification example is equipped with a joint portion 15*e* on a more upstream side of the circulation path 15 than the pump 16.

The precipitation inhibitor supply 12 supplies the precipitation inhibitor to the joint portion 15*e*. Thus, it is possible to supply the precipitation inhibitor to the phosphoric acid aqueous solution L, to which fluidity is imparted, inside the circulation path 15. Therefore, according to the ninth modification example, it is possible to more efficiently mix the phosphoric acid aqueous solution L and the precipitation inhibitor.

Further, in the ninth modification example, the joint portion 15*e* is provided at the more upstream side than the pump 16. Thus, it is possible to mix the phosphoric acid aqueous solution L and the precipitation inhibitor inside the pump 16. That is, in the ninth modification example, the pump 16 also functions as a mixer.

Thus, there is no need to add a separate mixer. Therefore, it is possible to efficiently mix the phosphoric acid aqueous solution L and the precipitation inhibitor at low cost.

Furthermore, in the ninth modification example, the precipitation inhibitor just needs to be supplied into the phosphoric acid aqueous solution L flowing in the circulation path 15 so as not to degrade the fluidity of the phosphoric acid aqueous solution L. That is, the precipitation inhibitor just needs to be supplied at a lower flow velocity than the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the ninth modification example just needs to be performed according to the timing chart as illustrated in FIG. 2.

Figure 13:
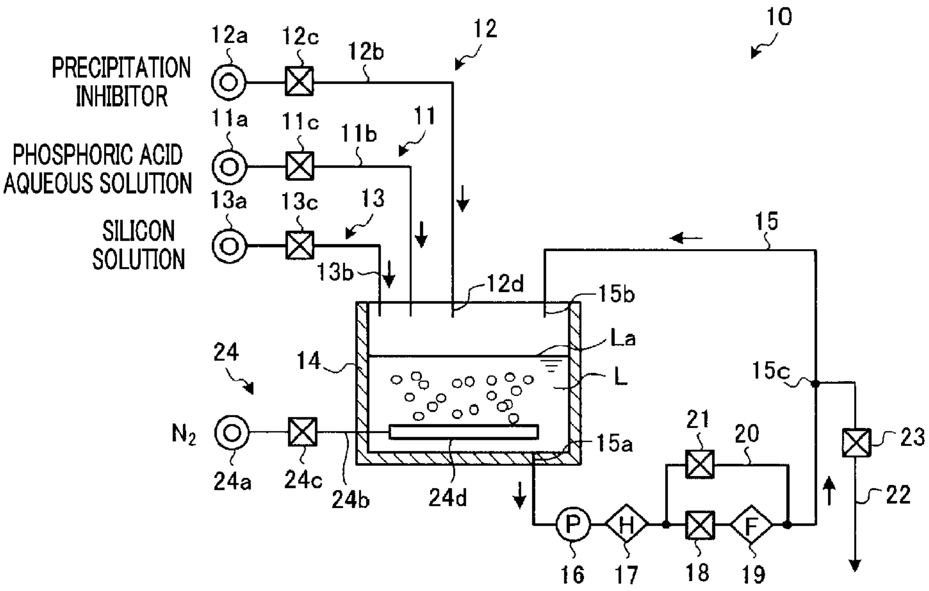
FIG. 13 is a schematic block diagram illustrating a configuration of the mixing apparatus according to a tenth modification example of the exemplary embodiment.

FIG. 13 is a schematic block diagram illustrating a configuration of the mixing apparatus 10 according to a tenth modification example of the exemplary embodiment. As illustrated in FIG. 13, the mixing apparatus 10 according to the tenth modification example is equipped with the precipitation inhibitor supply opening 12*d* of the precipitation inhibitor supply 12 at the upper portion of the tank 14.

Further, the mixing apparatus 10 according to the tenth modification example is equipped with a stirrer at the tank 14. In an example illustrated in FIG. 13, a bubbling device 24 as an example of the stirrer is provided at the tank 14.

The bubbling device 24 makes bubbles of the phosphoric acid aqueous solution L stored in the tank 14 with a bubbling gas. The bubbling device 24 is equipped with a bubbling gas source 24*a*, a bubbling gas supply path 24*b*, a flow rate controller 24*c* and a bubbling nozzle 24*d*.

In the bubbling device 24, the bubbling gas is supplied from the bubbling gas source 24*a* to the bubbling nozzle 24*d* through the bubbling gas supply path 24*b*. The bubbling nozzle 24*d* is provided, for example, at the lower portion of the tank 14 and extends in the horizontal direction.

Further, on the bubbling nozzle 24*d*, a plurality of discharge holes (not illustrated) for discharging the bubbling gas is provided side by side in the horizontal direction. Furthermore, since the bubbling gas is discharged from the plurality of discharge holes, the phosphoric acid aqueous solution L stored in the tank 14 can be bubbled. The bubbling gas is, for example, an inert gas such as a nitrogen gas.

Furthermore, in the tenth modification example, when the bubbling device 24 is operated, fluidity caused by an upward flow can be imparted to the phosphoric acid aqueous solution L stored in the tank 14.

Accordingly, the precipitation inhibitor is supplied while new fluidity is imparted to the phosphoric acid aqueous solution L. Thus, the contact area between the phosphoric acid aqueous solution L and the precipitation inhibitor can be further increased. Therefore, according to the tenth modification example, it is possible to more efficiently mix the phosphoric acid aqueous solution L and the precipitation inhibitor.

Moreover, in the tenth modification example, the bubbling device 24 without an actuator is used as the stirrer, and, thus, it is possible to suppress impurities from being mixed into the phosphoric acid aqueous solution L stored in the tank 14.

Figure 14:
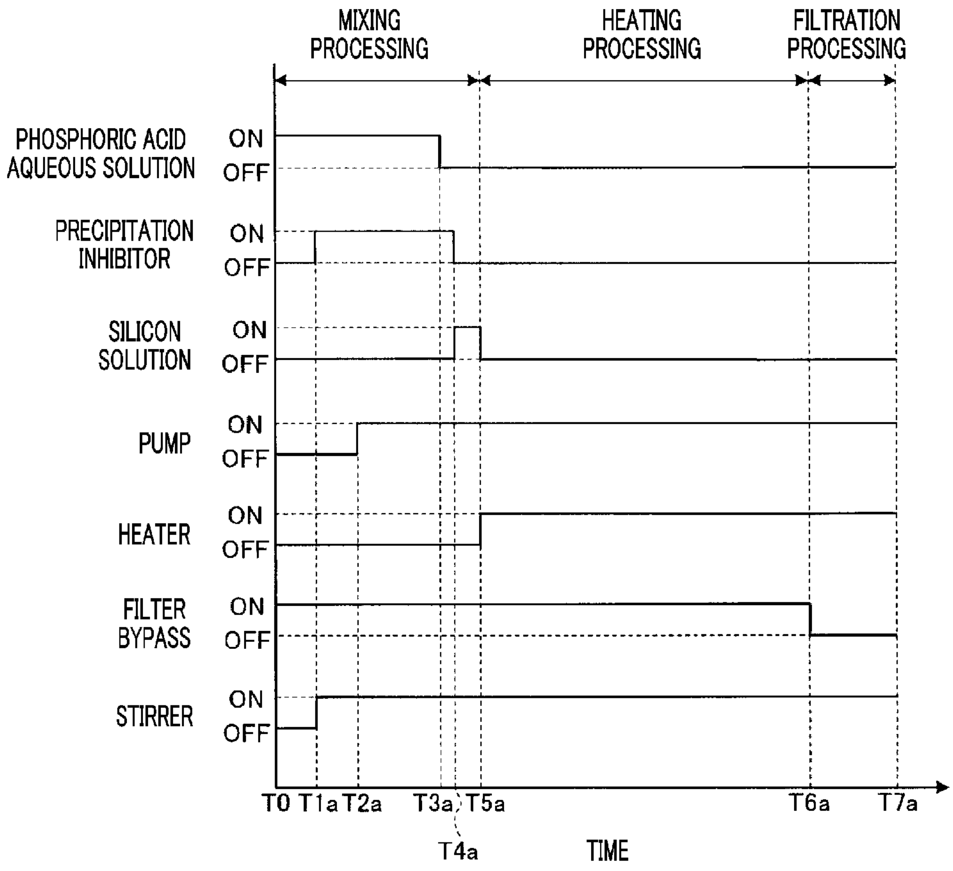
FIG. 14 is a timing chart illustrating an example of operation patterns of respective components of the mixing apparatus in an etching solution production processing according to the tenth modification example of the exemplary embodiment.

FIG. 14 is a timing chart illustrating an example of operation patterns of respective components of the mixing apparatus 10 in the etching solution production processing according to the tenth modification example of the exemplary embodiment. First, the controller starts a mixing processing by operating the phosphoric acid aqueous solution supply 11 (ON state) from the time point T0 to supply the phosphoric acid aqueous solution L into the tank 14.

At the time point T0, the precipitation inhibitor supply 12, the silicon solution supply 13, the pump 16 and the heater 17 do not operate (OFF state). Also, at the time point T0, the filter bypass is in the ON state and the stirrer (the bubbling device 24) does not operate (OFF state).

Then, at a time point T1*a* when a predetermined amount of the phosphoric acid aqueous solution L is stored in the tank 14, the controller operates the precipitation inhibitor supply 12 (ON state) to supply the precipitation inhibitor into the tank 14.

Also, at the same timing as the supply of the precipitation inhibitor starts (time point T1*a*), the controller operates the stirrer (the bubbling device 24) (ON state). Thus, it is possible to impart fluidity to the phosphoric acid aqueous solution L.

Accordingly, the precipitation inhibitor can be mixed with the phosphoric acid aqueous solution L to which fluidity is imparted, and, thus, it is possible to efficiently mix the phosphoric acid aqueous solution L and the precipitation inhibitor.

Further, in the tenth modification example, the precipitation inhibitor just needs to be supplied to be diffused on the liquid surface La of the phosphoric acid aqueous solution L flowing in the tank 14. That is, in the tenth modification example, the precipitation inhibitor just needs to be supplied a little at a time according to the fluidity of the phosphoric acid aqueous solution L. In other words, in the tenth modification example, the amount of the precipitation inhibitor to be supplied just needs to be set based on the fluidity of the phosphoric acid aqueous solution L.

Accordingly, since it is possible to suppress the concentration of the precipitation inhibitor in the phosphoric acid aqueous solution L from being locally increased, it is possible to suppress the gelation of the precipitation inhibitor.

Then, at a time point T2*a* when a predetermined time has elapsed from the time point T1*a*, the controller operates the pump 16 (ON state) to form the circulation flow in the circulation path 15. Thus, it is possible to impart new fluidity to the phosphoric acid aqueous solution L.

Then, at a time point T3*a* when a predetermined amount of the phosphoric acid aqueous solution L has been supplied into the tank 14, the controller stops the phosphoric acid aqueous solution supply 11 (OFF state). Then, at a time point T4*a* when a predetermined amount of the precipitation inhibitor has been supplied into the tank 14, the controller stops the precipitation inhibitor supply 12 (OFF state).

At the same timing as the supply of the precipitation inhibitor is stopped (time point T4*a*), the controller operates the silicon solution supply 13 (ON state) to supply the silicon solution into the tank 14.

Thereafter, at a time point T5*a* when a predetermined amount of the silicon solution has been supplied into the tank 14, the controller stops the silicon solution supply 13 (OFF state). Thus, the mixing processing is completed.

Although FIG. 14 illustrates an example where the silicon solution starts to be supplied later than the precipitation inhibitor, the supply of the precipitation inhibitor and the supply of the silicon solution may start at the same timing (time point T1*a*).

Then, the controller starts a heating processing by operating the heater 17 (ON state) from the time point T5*a* to heat the etching solution E circulating in the circulation path 15. The controller heats the etching solution E stored in the tank 14 by heating the etching solution E with the heater 17.

Then, at a time point T6*a* when the etching solution E in the tank 14 has been heated to a predetermined temperature (e.g., 165° C.), the heating processing is completed. Then, the controller starts a filtration processing by turning the filter bypass in the OFF state from the time point T6*a*.

Thereafter, at a time point T7*a* when the contaminants such as particles contained in the etching solution E are removed sufficiently, the filtration processing is completed. In this way, the etching solution production processing according to the tenth modification example is completed.

Figure 15:
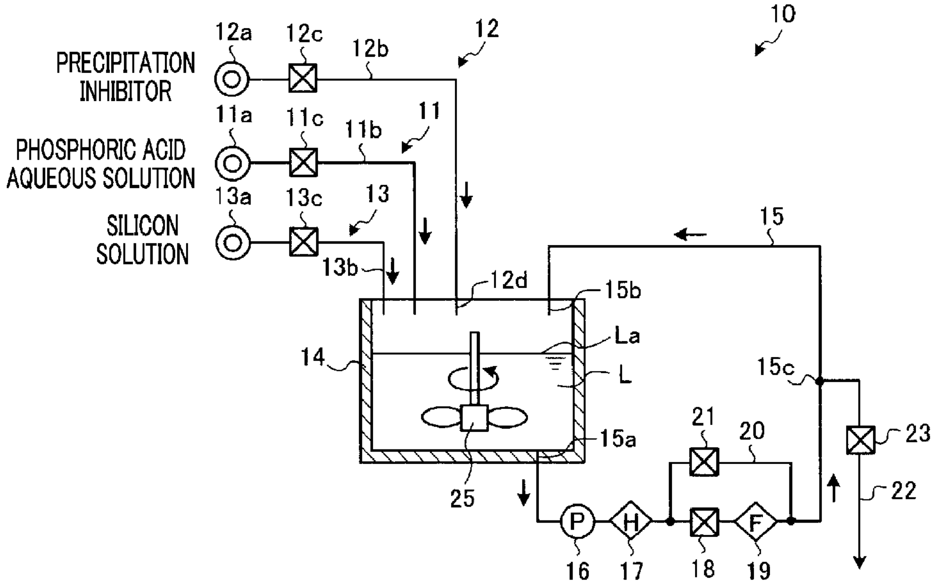
FIG. 15 is a schematic block diagram illustrating a configuration of the mixing apparatus according to an eleventh modification example of the exemplary embodiment.

FIG. 15 is a schematic block diagram illustrating a configuration of the mixing apparatus 10 according to an eleventh modification example of the exemplary embodiment. As illustrated in FIG. 15, the mixing apparatus 10 according to the eleventh modification example is equipped with a stirring blade 25 as another example of the stirrer at the lower portion of the tank 14.

Further, in the eleventh modification example, by operating an actuator (not illustrated) configured to rotate the stirring blade 25, fluidity caused by a vortex flow can be imparted to the phosphoric acid aqueous solution L stored in the tank 14.

Accordingly, the precipitation inhibitor is supplied while new fluidity is imparted to the phosphoric acid aqueous solution L. Thus, the contact area between the phosphoric acid aqueous solution L and the precipitation inhibitor can be further increased. Therefore, according to the eleventh modification example, it is possible to more efficiently mix the phosphoric acid aqueous solution L and the precipitation inhibitor.

Furthermore, in the eleventh modification example, by minutely controlling the actuator of the stirring blade 25, it is possible to minutely control a stirring speed. Accordingly, it is possible to more efficiently mix the phosphoric acid aqueous solution L and the precipitation inhibitor.

Moreover, in the eleventh modification example, the tank 14 just needs to be formed into a cylindrical shape. Accordingly, it is possible to readily form the vortex flow in the phosphoric acid aqueous solution L inside the tank 14. Therefore, it is possible to more efficiently mix the phosphoric acid aqueous solution L and the precipitation inhibitor.

Also, in the eleventh modification example, the precipitation inhibitor just needs to be supplied to be diffused on the liquid surface La of the phosphoric acid aqueous solution L flowing in the tank 14. That is, in the eleventh modification example, the precipitation inhibitor just needs to be supplied a little at a time according to the fluidity of the phosphoric acid aqueous solution L. In other words, in the eleventh modification example, the amount of the precipitation inhibitor to be supplied just needs to be set based on the fluidity of the phosphoric acid aqueous solution L.

Accordingly, since it is possible to suppress the concentration of the precipitation inhibitor in the phosphoric acid aqueous solution L from being locally increased, it is possible to suppress the gelation of the precipitation inhibitor.

Further, in the eleventh modification example, as illustrated in FIG. 8 and other drawings, the precipitation inhibitor may be supplied into the phosphoric acid aqueous solution L from the precipitation inhibitor supply opening 12*d* provided at the lower portion of the tank 14.

Accordingly, it is possible to actively attract the precipitation inhibitor to a vortex flow formed by the stirring blade 25. Therefore, it is possible to more efficiently mix the phosphoric acid aqueous solution L and the precipitation inhibitor.

In this case, the precipitation inhibitor just needs to be supplied into the phosphoric acid aqueous solution L flowing in the circulation path 15 so as not to degrade the fluidity of the phosphoric acid aqueous solution L. That is, the precipitation inhibitor just needs to be supplied at a lower flow velocity than the vortex flow formed in the phosphoric acid aqueous solution L.

Accordingly, it is possible to suppress the degradation of the fluidity of the phosphoric acid aqueous solution L and suppress poor mixing of the precipitation inhibitor. Also, the etching solution production processing according to the eleventh modification example just needs to be performed according to the timing chart as illustrated in FIG. 14.

Figure 16:
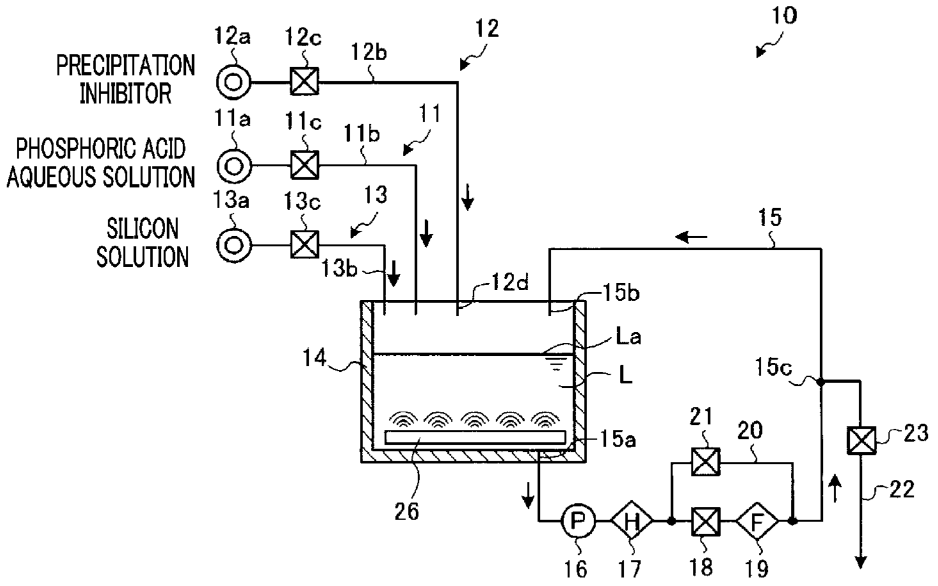
FIG. 16 is a schematic block diagram illustrating a configuration of the mixing apparatus according to a twelfth modification example of the exemplary embodiment.

FIG. 16 is a schematic block diagram illustrating a configuration of the mixing apparatus 10 according to a twelfth modification example of the exemplary embodiment. As illustrated in FIG. 16, the mixing apparatus 10 according to the twelfth modification example is equipped with an ultrasonic generator 26 as another example of the stirrer at the lower portion of the tank 14.

The ultrasonic generator 26 can generate ultrasonic waves toward the phosphoric acid aqueous solution L stored in the tank 14. Further, in the twelfth modification example, by operating the ultrasonic generator 26, fluidity caused by the ultrasonic waves can be imparted to the phosphoric acid aqueous solution L stored in the tank 14.

Accordingly, the precipitation inhibitor is supplied while new fluidity is imparted to the phosphoric acid aqueous solution L. Thus, the contact area between the phosphoric acid aqueous solution L and the precipitation inhibitor can be further increased. Furthermore, in the twelfth modification example, the ultrasonic waves from the ultrasonic generator 26 are transmitted to the entire phosphoric acid aqueous solution L, and, thus, the stirring is performed throughout the phosphoric acid aqueous solution L.

Therefore, according to the twelfth modification example, it is possible to more efficiently mix the phosphoric acid aqueous solution L and the precipitation inhibitor.

Also, in the twelfth modification example, the ultrasonic waves from the ultrasonic generator 26 cause cavitation in the phosphoric acid aqueous solution L. For this reason, even if the precipitation inhibitor is gelated in the phosphoric acid aqueous solution L, it is possible to break the gel into smaller pieces.

That is, in the twelfth modification example, the dissolution of the gelated precipitation inhibitor can be accelerated, and, thus, it is possible to more efficiently mix the phosphoric acid aqueous solution L and the precipitation inhibitor.

Further, in the twelfth modification example, the precipitation inhibitor just needs to be supplied to be diffused on the liquid surface La of the phosphoric acid aqueous solution L flowing in the tank 14. That is, in the twelfth modification example, the precipitation inhibitor just needs to be supplied a little at a time according to the fluidity of the phosphoric acid aqueous solution L. In other words, in the twelfth modification example, the amount of the precipitation inhibitor to be supplied just needs to be set based on the fluidity of the phosphoric acid aqueous solution L.

Accordingly, since it is possible to suppress the concentration of the precipitation inhibitor in the phosphoric acid aqueous solution L from being locally increased, it is possible to suppress the gelation itself of the precipitation inhibitor. Also, the etching solution production processing according to the twelfth modification example just needs to be performed according to the timing chart as illustrated in FIG. 14.

Figure 17:
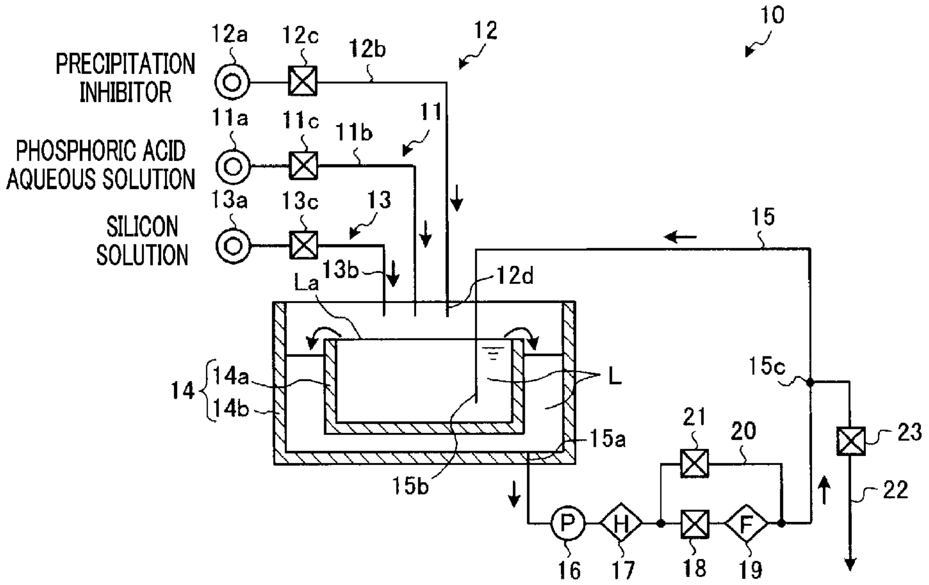
FIG. 17 is a schematic block diagram illustrating a configuration of the mixing apparatus according to a thirteenth modification example of the exemplary embodiment.

FIG. 17 is a schematic block diagram illustrating a configuration of the mixing apparatus 10 according to a thirteenth modification example of the exemplary embodiment. As illustrated in FIG. 17, the mixing apparatus 10 according to the thirteenth modification example is different in the configuration of the tank 14 from the exemplary embodiment. Specifically, the tank 14 according to the thirteenth modification example is equipped with an inner tank 14*a* and an outer tank 14*b*.

The inner tank 14*a* has an open top, and, thus, the phosphoric acid aqueous solution L, the precipitation inhibitor and the silicon solution are supplied near an upper portion of the inner tank 14*a*. That is, the phosphoric acid aqueous solution supply 11 supplies the phosphoric acid aqueous solution L into the inner tank 14*a*, the precipitation inhibitor supply 12 supplies precipitation inhibitor into the inner tank 14*a* and the silicon solution supply 13 supplies the silicon solution into the inner tank 14*a*.

The outer tank 14*b* is provided around the inner tank 14*a* and has an open top. The phosphoric acid aqueous solution L overflowing from the inner tank 14*a* is supplied into the outer tank 14*b*.

Further, the inlet 15*a* of the circulation path 15 is provided at a lower portion of the outer tank 14*b*. Furthermore, the outlet 15*b* of the circulation path 15 is provided at a lower portion of the inner tank 14*a*. That is, in the thirteenth modification example, the circulation flow of the phosphoric acid aqueous solution L is formed by the outer tank 14*b*, the circulation path 15 and the inner tank 14*a*.

Moreover, in the mixing apparatus 10 according to the thirteenth modification example, the phosphoric acid aqueous solution L is allowed to overflow from the inner tank 14*a* to the outer tank 14*b*, and, thus, fluidity caused by an upward flow can be imparted to the phosphoric acid aqueous solution L.

Accordingly, the precipitation inhibitor is supplied while new fluidity is imparted to the phosphoric acid aqueous solution L. Thus, the contact area between the phosphoric acid aqueous solution L and the precipitation inhibitor can be further increased. Therefore, according to the thirteenth modification example, it is possible to more efficiently mix the phosphoric acid aqueous solution L and the precipitation inhibitor.

Further, in the thirteenth modification example, the upward flow is formed in the inner tank 14*a* and the outer tank 14*b* that do not have an actuator, and, thus, it is possible to suppress the impurities from being mixed into the phosphoric acid aqueous solution L stored in the tank 14.

Furthermore, in the thirteenth modification example, the precipitation inhibitor just needs to be supplied into the inner tank 14*a* of the tank 14. Thus, it is possible to spread the precipitation inhibitor and make it thin on the liquid surface La of the phosphoric acid aqueous solution L overflowing from the inner tank 14*a*. That is, the contact area between the phosphoric acid aqueous solution L and the precipitation inhibitor can be further increased.

Therefore, according to the thirteenth modification example, it is possible to more efficiently mix the phosphoric acid aqueous solution L and the precipitation inhibitor.

Moreover, in the thirteenth modification example, the precipitation inhibitor just needs to be supplied to be diffused on the liquid surface La of the phosphoric acid aqueous solution L flowing in the inner tank 14*a*. That is, in the thirteenth modification example, the precipitation inhibitor just needs to be supplied a little at a time according to the fluidity of the phosphoric acid aqueous solution L. In other words, in the thirteenth modification example, the amount of the precipitation inhibitor to be supplied just needs to be set based on the fluidity of the phosphoric acid aqueous solution L.

Accordingly, since it is possible to suppress the concentration of the precipitation inhibitor in the phosphoric acid aqueous solution L from being locally increased, it is possible to suppress the gelation of the precipitation inhibitor.

Figure 18:
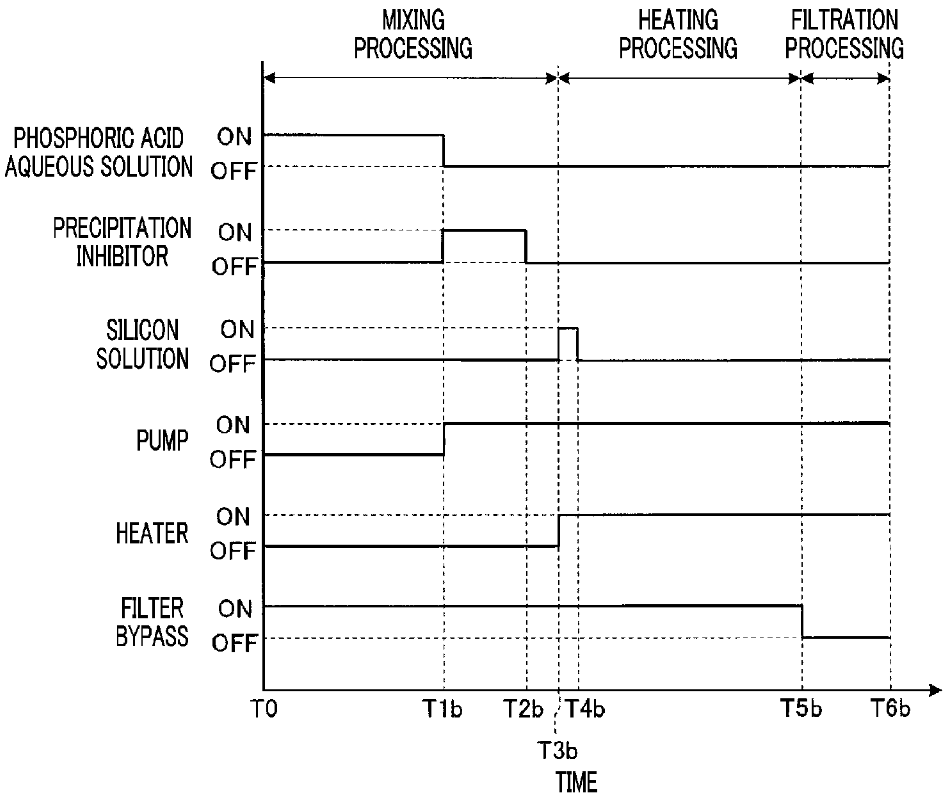
FIG. 18 is a timing chart illustrating an example of operation patterns of respective components of the mixing apparatus in an etching solution production processing according to the thirteenth modification example of the exemplary embodiment.

FIG. 18 is a timing chart illustrating an example of operation patterns of respective components of the mixing apparatus 10 in the etching solution production processing according to the thirteenth modification example of the exemplary embodiment. First, the controller starts a mixing processing by operating the phosphoric acid aqueous solution supply 11 (ON state) from the time point T0 to supply the phosphoric acid aqueous solution L into the tank 14.

At the time point T0, the precipitation inhibitor supply 12, the silicon solution supply 13, the pump 16 and the heater 17 do not operate (OFF state). Also, at the time point T0, the filter bypass is in the ON state.

Then, at a time point T1*b* when a predetermined amount of the phosphoric acid aqueous solution L is stored in the inner tank 14*a* and the outer tank 14*b* of the tank 14, the controller stops the phosphoric acid aqueous solution supply 11 (OFF state). Herein, the term "predetermined amount" refers to the amount in which at least the phosphoric acid aqueous solution L can overflow from the inner tank 14*a* and circulate in the circulation path 15.

At the same timing as the supply of the phosphoric acid aqueous solution L is stopped (time point T1*b*), the controller operates the precipitation inhibitor supply 12 and the pump 16 (ON state) to supply the precipitation inhibitor into the tank 14 and form the circulation flow in the circulation path 15. Thus, it is possible to supply the precipitation inhibitor to the phosphoric acid aqueous solution L overflowing from the inner tank 14*a*.

Then, at a time point T2*b* when a predetermined amount of the precipitation inhibitor has been supplied into the inner tank 14*a*, the controller stops the precipitation inhibitor supply 12 (OFF state). Then, the circulation flow is formed in the circulation path 15 to mix a chemical liquid in the tank 14 until a time point T3*b*, and, thus, the mixing processing is completed.

Then, the controller starts a heating processing by operating the heater 17 (ON state) from the time point T3*b* to heat the phosphoric acid aqueous solution L circulating in the circulation path 15. The controller heats the phosphoric acid aqueous solution L stored in the tank 14 by heating the phosphoric acid aqueous solution L with the heater 17.

At the same timing as the operation of the heater 17 is started (time point T3*b*), the controller operates the silicon solution supply 13 (ON state) to supply the silicon solution into the tank 14.

Thereafter, at a time point T4*b* when a predetermined amount of the silicon solution has been supplied into the tank 14, the controller stops the silicon solution supply 13 (OFF state). Also, at a time point T5*b* when the phosphoric acid aqueous solution L in the tank 14 has been heated to a predetermined temperature (e.g., 165° C.), the heating processing is completed.

Then, the controller starts a filtration processing by turning the filter bypass in the OFF state from the time point T5*b*.

Thereafter, at a time point T6*b* when the contaminants such as particles contained in the phosphoric acid aqueous solution L are removed sufficiently, the filtration processing is completed. In this way, the etching solution production processing according to the thirteenth modification example is completed.

Figure 19:
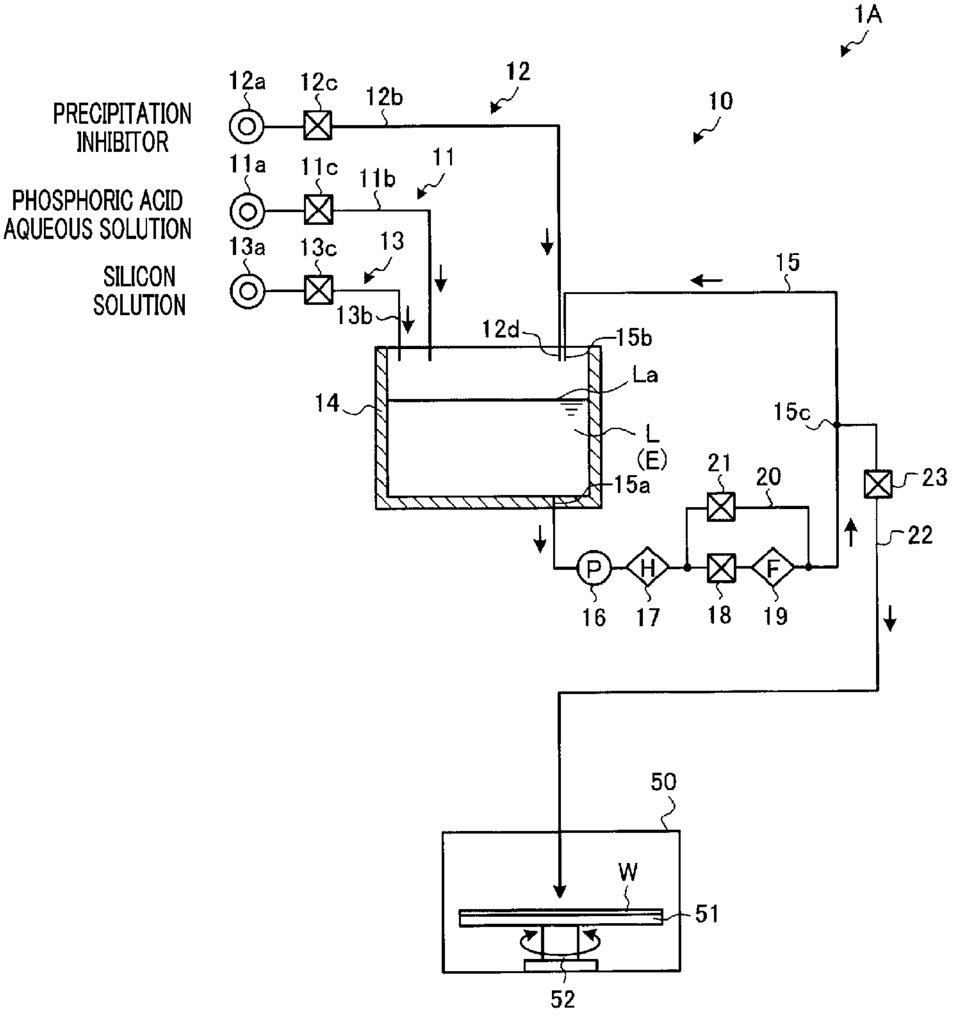
FIG. 19 is a schematic block diagram illustrating a configuration of a substrate processing system according to a fourteenth modification example of the exemplary embodiment.

FIG. 19 is a schematic block diagram illustrating a configuration of a substrate processing system 1A according to a fourteenth modification example of the exemplary embodiment. The substrate processing system 1A illustrated in FIG. 19 is different from the exemplary embodiment in that the substrate processing system 1A includes a substrate processing apparatus 50 configured to perform a single-wafer processing on each wafer W instead of the substrate processing apparatus 30 configured to perform a batch-type processing to a plurality of wafers W. Further, in FIG. 19, the same components as those in the exemplary embodiment illustrated in FIG. 1 will be assigned same reference numerals, and redundant description thereof will be omitted.

In the substrate processing system 1A illustrated in FIG. 19, the etching solution E circulating in the circulation path 15 is supplied into the substrate processing apparatus 50 via the solution sending path 22. The substrate processing apparatus 50 is equipped with a substrate holder 51 and a rotation mechanism 52.

The substrate holder 51 horizontally holds a wafer W. The rotation mechanism 52 rotates the substrate holder 51 and the wafer W held by the substrate holder 51. Further, the substrate processing system 1A may perform a single-wafer etching processing on the wafer W by discharging the etching solution E through the circulation path 15 and the solution sending path 22 to a top surface of the wafer W held by the substrate holder 51.

Although FIG. 19 illustrates an example where the mixing apparatus 10 according to the exemplary embodiment is combined with the substrate processing apparatus 50 that can perform a single-wafer processing, the mixing apparatus 10 according to the first to thirteenth modification examples may be combined with the substrate processing apparatus 50 configured to perform the single-wafer processing.

The mixing apparatus 10 according to the exemplary embodiment is equipped with the phosphoric acid aqueous solution supply 11, an additive supply (the precipitation inhibitor supply 12), the tank 14, the phosphoric acid aqueous solution supply path 11*b* and an additive supply path (the precipitation inhibitor supply path 12*b*). The phosphoric acid aqueous solution supply 11 is configured to supply the phosphoric acid aqueous solution L. The additive supply (the precipitation inhibitor supply 12) 11 is configured to supply an additive (the precipitation inhibitor) configured to suppress the precipitation of the silicon oxide. The phosphoric acid aqueous solution supply path 11*b* is configured to connect the phosphoric acid aqueous solution supply 11 with the tank 14. The additive supply path (the precipitation inhibitor supply path 12*b*) is configured to connect the additive supply (the precipitation inhibitor supply 12) with the tank 14. Further, the additive (the precipitation inhibitor) is supplied while fluidity is imparted to the phosphoric acid aqueous solution L supplied from the phosphoric acid aqueous solution supply 11 into the tank 14. Accordingly, it is possible to efficiently mix the phosphoric acid aqueous solution L and the precipitation inhibitor.

The mixing apparatus 10 according to the exemplary embodiment is further equipped with the circulation path 15 that comes out of the tank 14 and returns to the tank 14 and the pump 16 provided on the circulation path 15. Also, the fluidity is imparted to the phosphoric acid aqueous solution L by operating the pump 16 to form a circulation flow in the circulation path 15. Accordingly, it is possible to efficiently impart the fluidity to the phosphoric acid aqueous solution L.

Further, in the mixing apparatus 10 according to the exemplary embodiment, an additive supply opening (the precipitation inhibitor supply opening 12*d*) through which the additive (the precipitation inhibitor) is supplied from the additive supply path (the precipitation inhibitor supply path 12*b*) into the tank 14 is provided adjacent to the outlet 15*b* of the circulation path 15. Thus, the precipitation inhibitor can be directly supplied into the phosphoric acid aqueous solution L discharged from the outlet 15*b* and has high fluidity.

Furthermore, in the mixing apparatus 10 according to the exemplary embodiment, an additive supply opening (the precipitation inhibitor supply opening 12*d*) through which the additive (the precipitation inhibitor) is supplied from the additive supply path (the precipitation inhibitor supply path 12*b*) into the tank 14 is provided adjacent to the inlet 15*a* of the circulation path 15. Thus, the precipitation inhibitor can be rapidly supplied to the circulation path 15. Therefore, it is possible to supply the precipitation inhibitor into the phosphoric acid aqueous solution L, to which the high fluidity is imparted, within the circulation path 15.

Moreover, the mixing apparatus 10 according to the exemplary embodiment is further equipped with a stirrer provided in the tank 14. Also, the fluidity is imparted to the phosphoric acid aqueous solution L by operating the stirrer. Thus, it is possible to efficiently impart the fluidity to the phosphoric acid aqueous solution L.

In the mixing apparatus 10 according to the exemplary embodiment, the stirrer is the bubbling device 24 configured to supply a bubbling gas into the phosphoric acid aqueous solution L stored in the tank 14. Thus, it is possible to impart the fluidity caused by the upward flow to the phosphoric acid aqueous solution L stored in the tank 14.

Further, in the mixing apparatus 10 according to the exemplary embodiment, the stirrer is the stirring blade 25 configured to stir the phosphoric acid aqueous solution L stored in the tank 14. Thus, it is possible to impart the fluidity caused by the vortex flow to the phosphoric acid aqueous solution L stored in the tank 14.

Furthermore, in the mixing apparatus 10 according to the exemplary embodiment, the stirrer is the ultrasonic generator 26 configured to generate ultrasonic waves toward the phosphoric acid aqueous solution L stored in the tank 14. Thus, it is possible to impart the fluidity caused by the ultrasonic waves to the phosphoric acid aqueous solution L stored in the tank 14.

Moreover, in the mixing apparatus 10 according to the exemplary embodiment, multiple additive supply openings (the precipitation inhibitor supply openings 12*d*) through which the additive (the precipitation inhibitor) is supplied from the additive supply path (the precipitation inhibitor supply path 12*b*) into the tank 14 are provided at the upper portion of the tank 14. Thus, the contact area between the phosphoric acid aqueous solution L and the precipitation inhibitor can be increased. Therefore, it is possible to more efficiently mix the phosphoric acid aqueous solution L with the precipitation inhibitor.

Further, in the mixing apparatus 10 according to the exemplary embodiment, the additive supply opening (the precipitation inhibitor supply opening 12*d*) through which the additive (the precipitation inhibitor) is supplied from the additive supply path (the precipitation inhibitor supply path 12*b*) into the tank 14 is provided at the lower portion of the tank 14. Thus, it is possible to suppress the precipitation inhibitor from staying only on the liquid surface La of the phosphoric acid aqueous solution L. Therefore, it is possible to suppress the concentration of the precipitation inhibitor on the liquid surface La from being locally increased and suppress the gelation of the precipitation inhibitor.

Furthermore, in the mixing apparatus 10 according to the exemplary embodiment, the tank 14 is equipped with the inner tank 14*a* and the outer tank 14*b*. Moreover, the fluidity is imparted to the phosphoric acid aqueous solution L by overflowing the phosphoric acid aqueous solution L from the inner tank 14*a* to the outer tank 14*b*. Accordingly, it is possible to impart the fluidity caused by the upward flow to the phosphoric acid aqueous solution L stored in the tank 14.

Also, in the mixing apparatus 10 according to the exemplary embodiment, the additive (the precipitation inhibitor) is supplied into the inner tank 14*a*. Thus, it is possible to thinly diffuse the precipitation inhibitor on the liquid surface La of the phosphoric acid aqueous solution L overflowing from the inner tank 14*a*. Therefore, the contact area between the phosphoric acid aqueous solution L and the precipitation inhibitor can be further increased.

The mixing apparatus 10 according to the exemplary embodiment is further equipped with the heater 17 configured to heat the phosphoric acid aqueous solution L stored in the tank 14. Thus, the heated etching solution E can be supplied into the substrate processing apparatus 30.

<Details of Etching Solution Production Processing and Substrate Processing>

Figure 20:
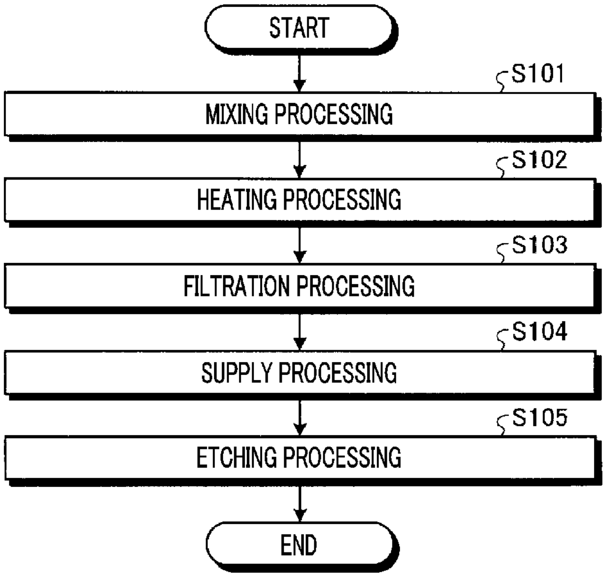
FIG. 20 is a flowchart showing a processing sequence of an etching solution production processing and a substrate processing according to the exemplary embodiment.

Hereinafter, an etching solution production processing and a substrate processing performed by the substrate processing system 1 according to the exemplary embodiment will be described in detail with reference to FIG. 20. FIG. 20 is a flowchart showing a processing sequence of the etching solution production processing and the substrate processing according to the exemplary embodiment.

First, the controller operates the mixing apparatus 10 to perform a mixing processing of mixing the phosphoric acid aqueous solution L, the precipitation inhibitor and the silicon solution (process S101). For example, the controller mixes the phosphoric acid aqueous solution L, the precipitation inhibitor and the silicon solution by supplying the precipitation inhibitor and the silicon solution to the phosphoric acid aqueous solution L while fluidity is imparted to the phosphoric acid aqueous solution L stored in the tank 14.

Then, the controller operates the heater 17 of the mixing apparatus 10 to perform a heating processing of heating a mixed solution of the phosphoric acid aqueous solution L, the precipitation inhibitor and the silicon solution (process S102).

Then, the controller performs a filtration processing of filtering the mixed solution of the phosphoric acid aqueous solution L, the precipitation inhibitor and the silicon solution through the filter 19 (process S103). When the filtration processing is completed, the etching solution production processing according to the exemplary embodiment is completed.

Then, the controller operates the mixing apparatus 10 and the substrate processing apparatus 30 to perform a supply processing in which the etching solution E is supplied from the mixing apparatus 10 to the substrate processing apparatus 30 (process S104). Thus, the etching solution E is stored in the processing tank 31 of the substrate processing apparatus 30.

Then, the controller operates the substrate processing apparatus 30 to perform an etching processing of etching a wafer W with the etching solution E stored in the processing tank 31 (process S105). Then, when the etching processing is completed, the substrate processing according to the exemplary embodiment is completed.

The mixing method according to the exemplary embodiment includes a mixing process (process S101) and a heating process (process S102). The mixing process (process S101) supplies an additive (the precipitation inhibitor) for suppressing the precipitation of silicon oxide to the flowing phosphoric acid aqueous solution L and mixes them. The heating process (process S102) heats the mixed solution of the phosphoric acid aqueous solution L and the additive (the precipitation inhibitor). Thus, it is possible to heat the etching solution E that is efficiently mixed and supply the heated etching solution E into the substrate processing apparatus 30.

Further, in the mixing method according to the exemplary embodiment, the mixing process (process S101) includes supplying the additive (the precipitation inhibitor) to be diffused on the liquid surface La of the flowing phosphoric acid aqueous solution L. Thus, it is possible to further suppress the concentration of the precipitation inhibitor in the phosphoric acid aqueous solution L from being locally increased. Therefore, it is possible to further suppress the gelation of the precipitation inhibitor.

Furthermore, in the mixing method according to the exemplary embodiment, the mixing process includes supplying the additive (the precipitation inhibitor) into the flowing phosphoric acid aqueous solution L so as not to degrade the fluidity of the phosphoric acid aqueous solution L. Thus, it is possible to suppress the degradation of the fluidity of the phosphoric acid aqueous solution L and suppress poor mixing of the precipitation inhibitor.

According to the exemplary embodiments, it is possible to efficiently mix the additive configured to suppress the precipitation of the silicon oxide and the phosphoric acid aqueous solution.

While the present disclosure has been described with reference to the exemplary embodiments, the present disclosure is not limited to the exemplary embodiments but may be variously modified without departing from the spirit thereof.

The exemplary embodiments disclosed herein are illustrative in all aspects and not limited thereto. In fact, the above exemplary embodiments can be embodied in various forms. Further, the above-described exemplary embodiments may be omitted, substituted, or changed in various forms without departing from the scope of the appended claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A mixing apparatus, comprising:
a tank configured to mix a phosphoric acid aqueous solution and an additive configured to suppress precipitation of a silicon oxide;
a phosphoric acid aqueous solution supply configured to supply the phosphoric acid aqueous solution to the tank;
an additive supply having multiple supply openings provided at an upper portion of the tank and arranged in a horizontal direction, and configured to supply the additive;
a circulation path through which the phosphoric acid aqueous solution stored in the tank comes out of the tank and returns to the tank; wherein the circulation path has an inlet provided at a lower portion of the tank and an outlet provided at the upper portion of the tank,
a pump provided on the circulation path and configured to form a circulation flow of the phosphoric acid aqueous solution which comes out of the tank and returns to the tank through the circulation path; and
a controller configured to:
supply the phosphoric acid aqueous solution to the tank from the phosphoric acid aqueous solution supply to store a predetermined amount of the phosphoric acid aqueous solution in the tank;
operate the pump to form the circulation flow of the phosphoric acid aqueous solution such that a fluidity is imparted to the phosphoric acid aqueous solution;
supply, from the multiple supply openings of the additive supply, the additive from above a liquid surface of the phosphoric acid aqueous solution to the liquid surface of the phosphoric acid aqueous solution to which the fluidity is imparted; and
control a nozzle of the additive supply to diffuse the additive on the liquid surface of the phosphoric acid aqueous solution to suppress a concentration of the additive from being locally increased.

2. The mixing apparatus of claim 1,
wherein the multiple supply openings of the additive supply are provided adjacent to the outlet of the circulation path.

3. The mixing apparatus of claim 2,
wherein the controller is further configured to supply a mixed liquid mixed in the tank to a processing tank through a solution sending path, the processing tank being configured to perform an etching processing by immersing a substrate in an etching solution, and the etching solution containing the mixed liquid of the phosphoric acid aqueous solution and the additive.

4. The mixing apparatus of claim 2, further comprising:
a stirrer provided in the tank,
wherein the controller is further configured to operate the stirrer to impart an additional fluidity to the phosphoric acid aqueous solution.

5. The mixing apparatus of claim 2, further comprising:
a heater configured to heat the phosphoric acid aqueous solution stored in the tank.

6. The mixing apparatus of claim 1, further comprising:
a stirrer provided in the tank,
wherein the controller is further configured to operate the stirrer to impart an additional fluidity to the phosphoric acid aqueous solution.

7. The mixing apparatus of claim 6,
wherein the stirrer is a bubbling device configured to supply a bubbling gas into the phosphoric acid aqueous solution stored in the tank.

8. The mixing apparatus of claim 6,
wherein the stirrer is a stirring blade configured to stir the phosphoric acid aqueous solution stored in the tank.

9. The mixing apparatus of claim 6,
wherein the stirrer is an ultrasonic generator configured to generate ultrasonic waves toward the phosphoric acid aqueous solution stored in the tank.

10. The mixing apparatus of claim 6, further comprising:
a heater configured to heat the phosphoric acid aqueous solution stored in the tank.

11. The mixing apparatus of claim 1,
wherein the controller is further configured to supply a mixed liquid mixed in the tank to a processing tank through a solution sending path, the processing tank being configured to perform an etching processing by immersing a substrate in an etching solution, and the etching solution containing the mixed liquid in which the phosphoric acid aqueous solution and the additive are mixed.

12. The mixing apparatus of claim 11, further comprising:
a stirrer provided in the tank,
wherein the controller is further configured to operate the stirrer to impart an additional fluidity to the phosphoric acid aqueous solution.

13. The mixing apparatus of claim 11, further comprising:
a heater configured to heat the phosphoric acid aqueous solution stored in the tank.

14. The mixing apparatus of claim 1, further comprising:
a heater configured to heat the phosphoric acid aqueous solution stored in the tank.

15. A mixing method, comprising:
a mixing process of storing a predetermined amount of a phosphoric acid aqueous solution in a tank; forming a circulation flow of the phosphoric acid aqueous solution by operating a pump provided on a circulation path which comes out of the tank and returns to the tank such that a fluidity is imparted to the phosphoric acid aqueous solution, wherein the circulation path has an inlet provided at a lower portion of the tank and an outlet provided at an upper portion of the tank; and supplying, from multiple supply openings of an additive supply provided at an upper portion of the tank and arranged in a horizontal direction, an additive from above a liquid surface of the phosphoric acid aqueous solution to the liquid surface of the phosphoric acid aqueous solution to which the fluidity is imparted; and controlling a nozzle of the additive supply to mix the additive to be diffused on the liquid surface of the phosphoric acid aqueous solution to which fluidity is imparted to suppress a concentration of the additive from being locally increased; and
a heating process of heating a mixed solution of the phosphoric acid aqueous solution and the additive.

16. A substrate processing system, comprising:
a mixing apparatus as claimed in claim 1; and
a substrate processing apparatus configured to process a substrate with a mixed solution of the phosphoric acid aqueous solution and the additive mixed in the mixing apparatus.

* * * * *